US012167560B1

(12) United States Patent
An et al.

(10) Patent No.: US 12,167,560 B1
(45) Date of Patent: Dec. 10, 2024

(54) LOW PROFILE MECHANISM ENABLING FRONT SERVICE OF ELECTRONIC CHASSIS COMPONENTS

(71) Applicant: ZT Group Int'l, Inc., Secaucus, NJ (US)

(72) Inventors: Chen An, Secaucus, NJ (US); Mahesh Kumar Varrey, Secaucus, NJ (US); Son Hung Lam, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 238 days.

(21) Appl. No.: 17/831,897

(22) Filed: Jun. 3, 2022

Related U.S. Application Data

(63) Continuation-in-part of application No. 17/098,811, filed on Nov. 16, 2020, now Pat. No. 11,490,536.

(51) Int. Cl.
*H05K 7/14* (2006.01)
(52) U.S. Cl.
CPC ......... *H05K 7/1401* (2013.01); *H05K 7/1489* (2013.01)
(58) Field of Classification Search
CPC ........................... H05K 7/1401; H05K 7/1489
USPC ........................................................ 361/752
See application file for complete search history.

(56) References Cited

U.S. PATENT DOCUMENTS

| 6,195,259 | B1 * | 2/2001 | Whitman | H05K 7/1409 |
| | | | | 361/801 |
| 2007/0087594 | A1 * | 4/2007 | Kosugi | G06F 1/186 |
| | | | | 439/92 |
| 2008/0123274 | A1 * | 5/2008 | Desrosiers | H05K 7/1402 |
| | | | | 361/741 |

* cited by examiner

*Primary Examiner* — Hung S. Bui
(74) *Attorney, Agent, or Firm* — Dergosits & Noah LLP; Todd A. Noah

(57) ABSTRACT

An elevator provides for sliding and connecting or disconnecting an electronic device from a chassis circuit board and the subsequent removal of the device from a chassis slot. A sliding element between the device and the chassis includes tracks within which travel followers. Motion of the sliding element in a first direction causes the tracks to move with respect to the followers, pulling the device connector away from the mating circuit board connector. In a fully disconnected position, the device may be removed from the slot. Motion of the sliding element in the opposite direction causes the relative motion between the tracks and followers to urge the device connector toward the circuit board connector until, in a fully seated position, the device is connected to the circuit board.

18 Claims, 21 Drawing Sheets

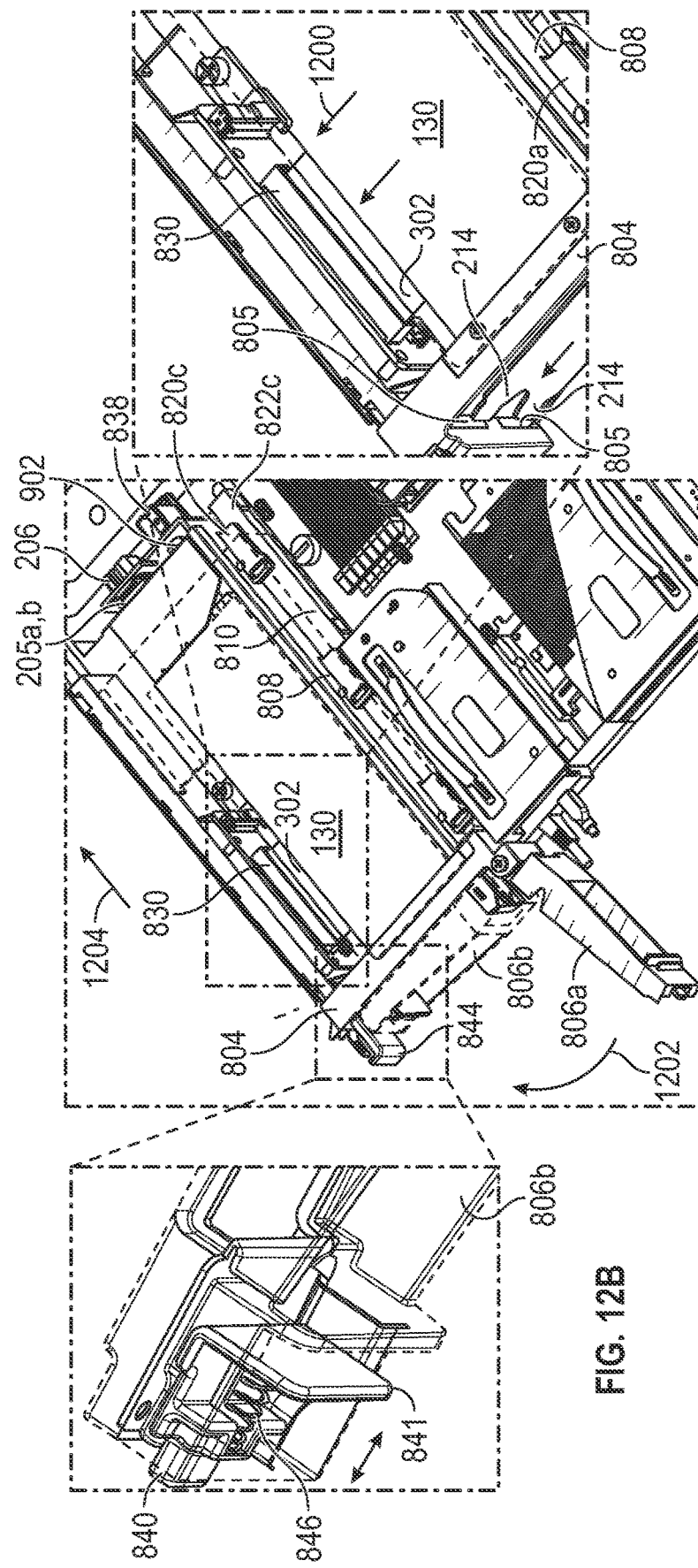

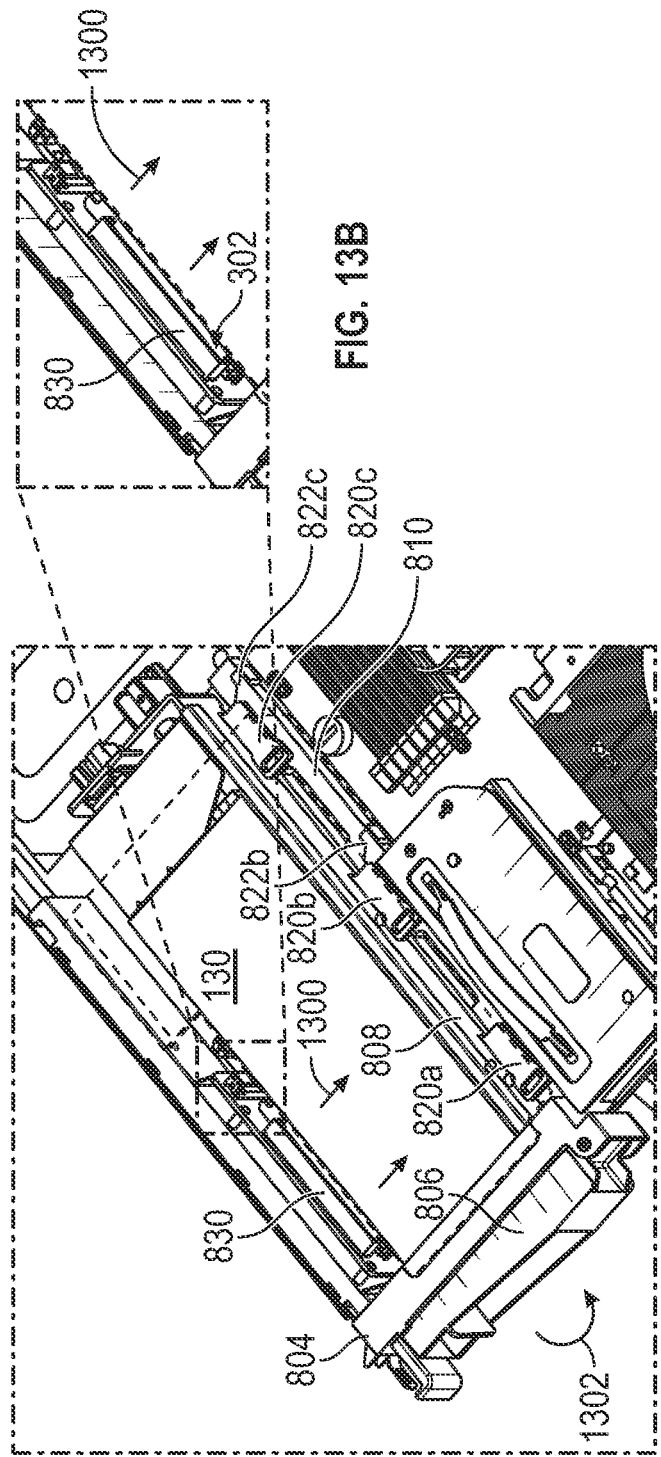

LOW PROFILE MECHANISM ENABLING FRONT SERVICE OF ELECTRONIC CHASSIS COMPONENTS

CROSS-REFERENCE TO RELATED CASES

This application is a continuation-in-part of U.S. patent application Ser. No. 17/098,811, entitled "Elevator Mechanism Enabling Front Service Of Electronic Chassis Components," filed Nov. 16, 2020, which is hereby incorporated by reference.

BACKGROUND

An expansion chassis may be provided with a considerable number of slots, each slot populated with an electronic device, such as a PCIe-compatible device. Typically, the service of an individual device requires the complete removal of the chassis, or of a nested tray within the chassis, to access the individual device. As a result, the effort needed to service a single device is multiplied. In addition, the connections associated with other devices may be needlessly disturbed, which may lead to increased times between failures.

Thus, what is needed is an apparatus that provides for the disconnection and removal of a single device from a chassis without disturbing the surrounding devices.

BRIEF DESCRIPTION OF THE DRAWINGS

The embodiments are illustrated by way of example and not limitation in the accompanying drawings, in which like references indicate similar elements, and in which:

FIG. 12A is an upper front right perspective view of elements of the embodiment of a low-profile apparatus for facilitating the service of an electronic device in a second state;

FIG. 12B is an upper front right perspective view of the region indicated in FIG. 12A;

FIG. 12C is an upper front right perspective view of the region indicated in FIG. 12A;

FIG. 13A is an upper front right perspective view of elements of the embodiment of a low-profile apparatus for facilitating the service of an electronic device in a third state;

FIG. 13B is an upper front right perspective view of the region indicated in FIG. 13A;

DETAILED DESCRIPTION

In embodiments, an apparatus provides for the disconnection and removal of a single device from a chassis without disturbing the surrounding devices. Generally, the embodiments provide for: 1) disconnecting the electronic device by elevating the device with respect to the PCB connector; 2) extracting and replacing the electronic device; and 3) reconnecting the electronic device by causing it to descend and reconnect to the PCB connector, all without requiring that any surrounding devices be disturbed.

In an embodiment, an inner housing or "elevator" is constrained to move vertically within an outer housing. The vertical movement is caused by a horizontal sliding piece situated between the inner (elevator) and outer (cage) housings. The sliding piece includes a track. Followers disposed on the inner housing follow the track, which causes the inner housing to raise or lower as the followers move along the track, depending on the direction of movement forward or rearward. With the inner housing constrained to move vertically with respect to the outer housing, the horizontal motion of the sliding piece is converted into vertical motion of the inner housing. In the raised position, with the electronic device disconnected, the inner housing may be removed from the outer housing. The electronic device may then be removed from the inner housing and serviced or replaced. In the embodiment, the horizontal slider is actuated by a handle rotating about a pin with respect to the outer cage. The rotary motion of the handle out and down is converted to forward motion of the slider, which causes the inner housing to be raised. Conversely, rotating the handle rearward is converted to rearward motion of the slider, which causes both the inner housing to be lowered and the connection established. In an embodiment, the travel may be 9 mm, which in the embodiment is sufficient to engage or disengage a PCIe connecter from an associated connector on a PCB.

In an embodiment, the inner housing may accommodate a carrier dimensioned to hold a PCIe device. In the embodiment, the carrier may be constrained to slide horizontally with respect to the inner housing such that the carrier may be removed from or inserted into the inner housing when the inner housing is raised (in an "eject position"), at which point a connector associated with an electronic device would be in a raised and disconnected position. In embodiments, the inner housing, outer housing, carrier, and slider may be constructed of sheet metal, or other appropriate material.

Figure 1:
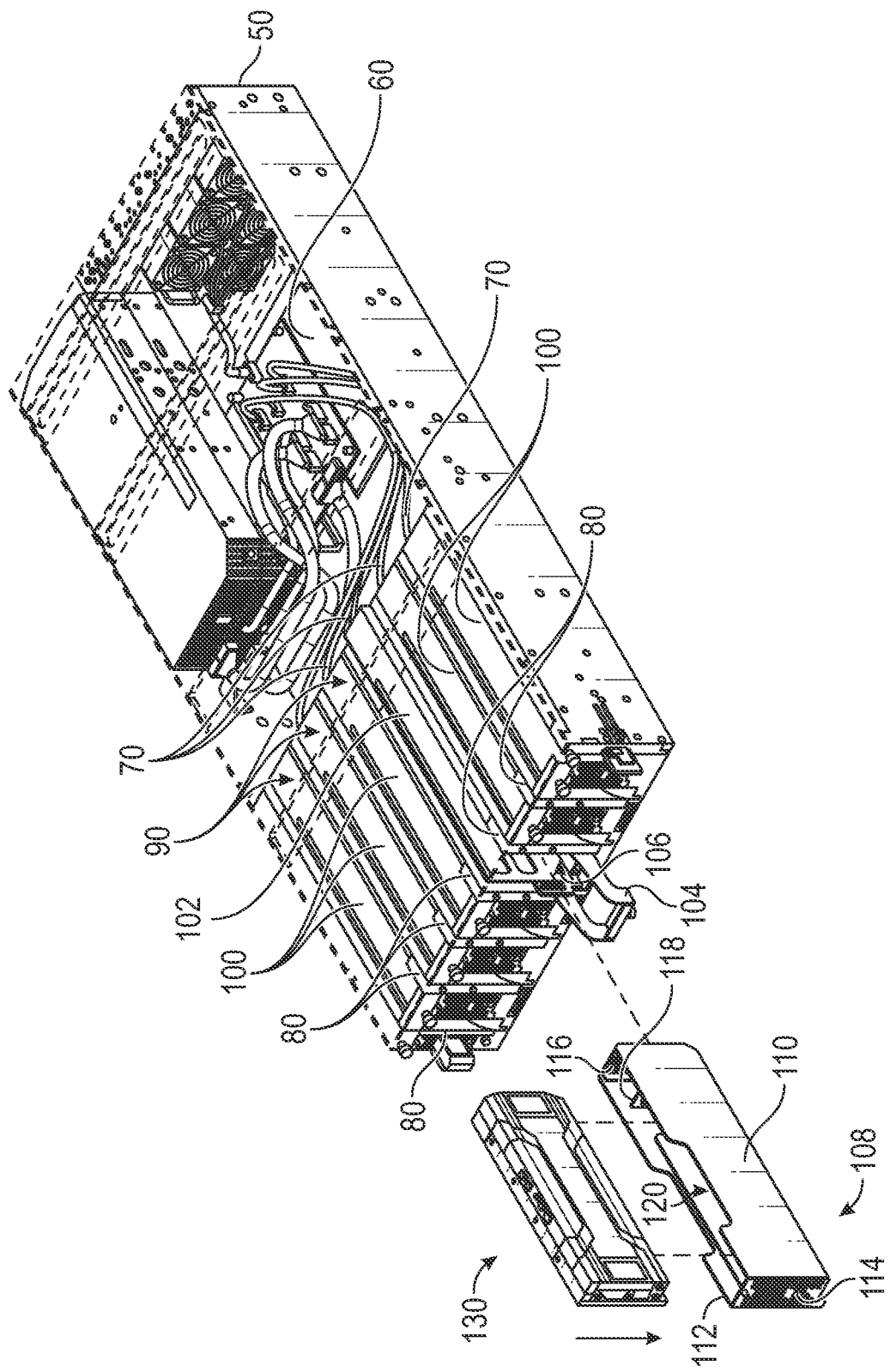
FIG. 1 is a perspective view illustrating an embodiment of an apparatus for facilitating the service of an electronic device.

FIG. 1 is a perspective view illustrating an embodiment of an elevator mechanism 100 for facilitating the service of an electronic device 130. In FIG. 1, elevator mechanisms 100 are shown inserted into chassis positions or slots 90, defined by partitions 80, within a chassis 50. In the exemplary use case, chassis 50 is an expansion chassis and electronic device 130 is a GPU with a PCIe-compatible connection. Each elevator mechanism 100 includes an elevator housing 102 with an associated handle 104 and a front entry port 106. Chassis 50 includes a base board 60, e.g., a PCB, with two sets of connectors to electronic devices 130. A first set of connectors are power connectors 70, which terminate at the rear of each slot 90 and connect to outer connectors 206 (FIG. 2B) on the rear of carrier 108. A second set of connectors are connectors 502 (FIG. 5), which may be provided directly on PCB 60 at the base of each slot 90 (see FIG. 5A-6D). Carrier 108 includes perforated sections 114, 116, 118 that allow for air flow, e.g., for cooling of electronic device 130. In an embodiment, perforated section 118 may be moved within slot 120 to accommodate electronic devices 130 of different lengths.

Figure 5A:
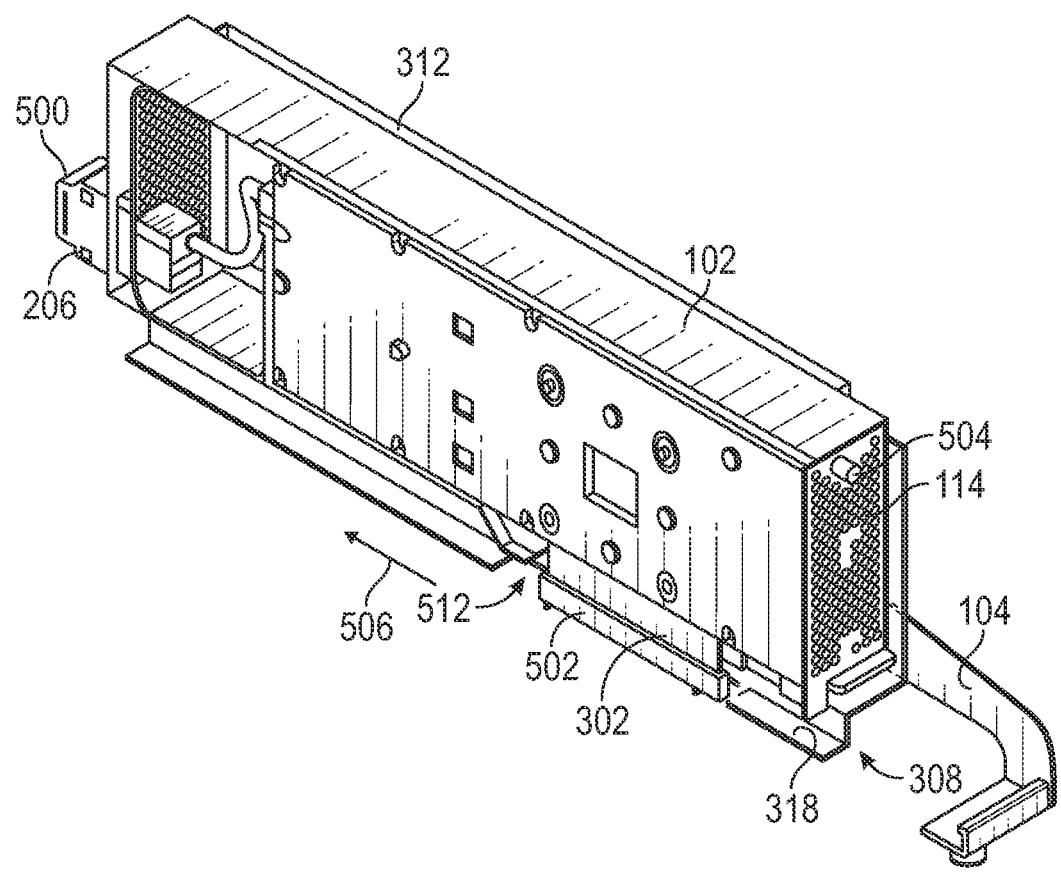
FIG. 5A is a front left, partially transparent perspective view illustrating the embodiment of an apparatus for facilitating the service of an electronic device.

To populate elevator housing 102, electronic device 130 is inserted into a slot 120 between sides 110, 112 of a carrier 108. A power connection is made between electronic device 130 and an outer connector 206 (FIG. 2B) of carrier 108. The populated carrier 108 is then inserted into front entry port 106 until outer connector 206 is connected at the rear of slot 90 to a chassis connector 500 (FIG. 5A). The connection is made blindly, since both connectors are obscured. Handle 104 is then closed, i.e., rotated upward and in. As will be described further, the closing of handle 104 actuates the elevator mechanism that lowers elevator housing 102 (with carrier 108 and electronic device 130), with respect to partition 80 and PCB 60, and causes a connector 302 (FIG. 3) to engage with a connector 502 (FIG. 5) of PCB 60. The removal of electronic device 130 is the reverse of the connection process. Thus, in the insertion and removal of a single electronic device 130, none of the surrounding electronic devices are disturbed.

Figure 2A:
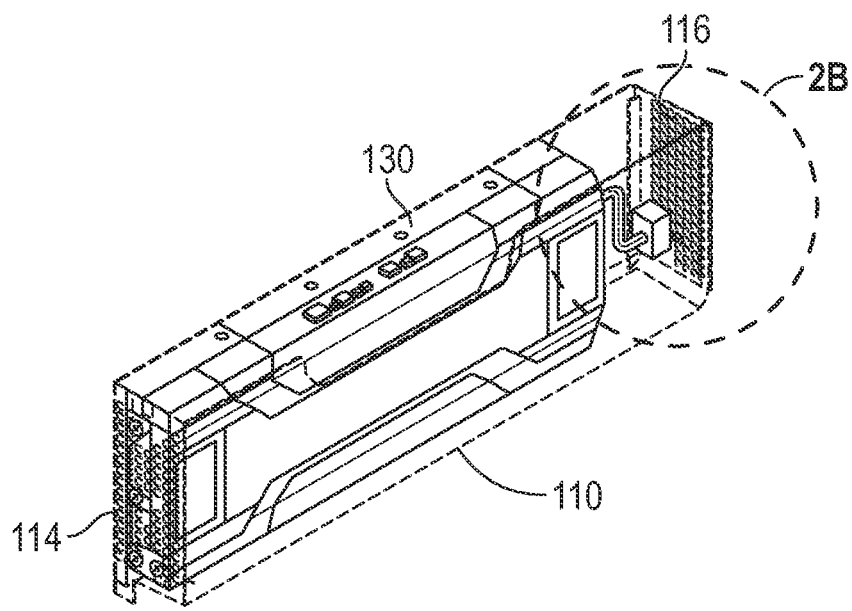
FIG. 2A is a front right perspective view illustrating aspects of the embodiment of an apparatus for facilitating the service of an electronic device.

FIG. 2A is a front right perspective view illustrating carrier 108 populated with electronic device 130. In FIG. 2A, side 110 is rendered partially transparent to show the connection between electronic device 130 and carrier 108.

Figure 2B:
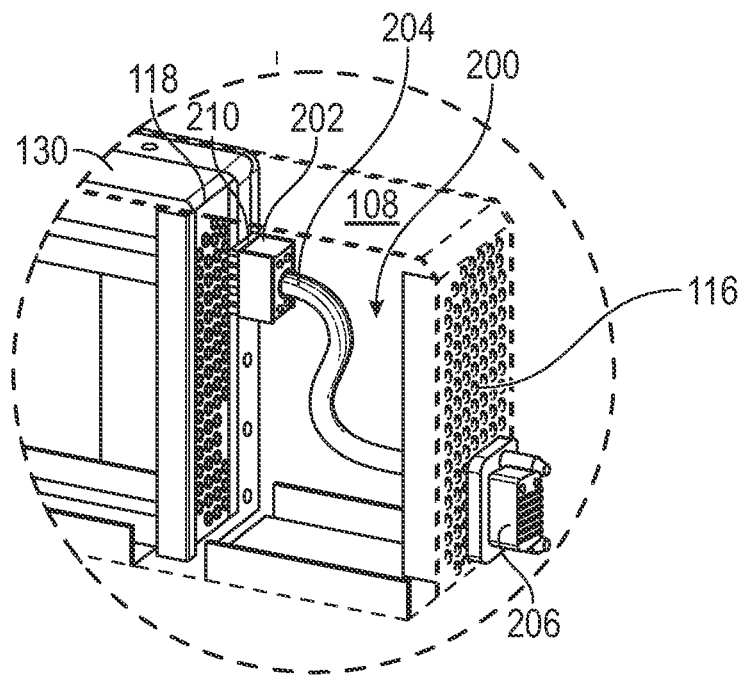
FIG. 2B is a rear perspective view illustrating the indicated section of FIG. 2A.

FIG. 2B is a rear perspective view illustrating the indicated section of FIG. 2A. In FIG. 2B, carrier 108 is shown to have a power connection 200 that includes an inner connector 202, wiring 204, and outer connector 206. Inner connector 202 is configured to connect to a connector 210 of electronic device 130. In embodiments, inner connector 202 and perforated section 119 may be modified to accommodate different sized devices and connectors. Thus, in embodiments, the different elevator mechanisms 100 may be populated with different types of devices, e.g., different types of PCIe devices, such as GPUs, hard drives, SSDs, Wi-Fi, and Ethernet devices.

Figure 3:
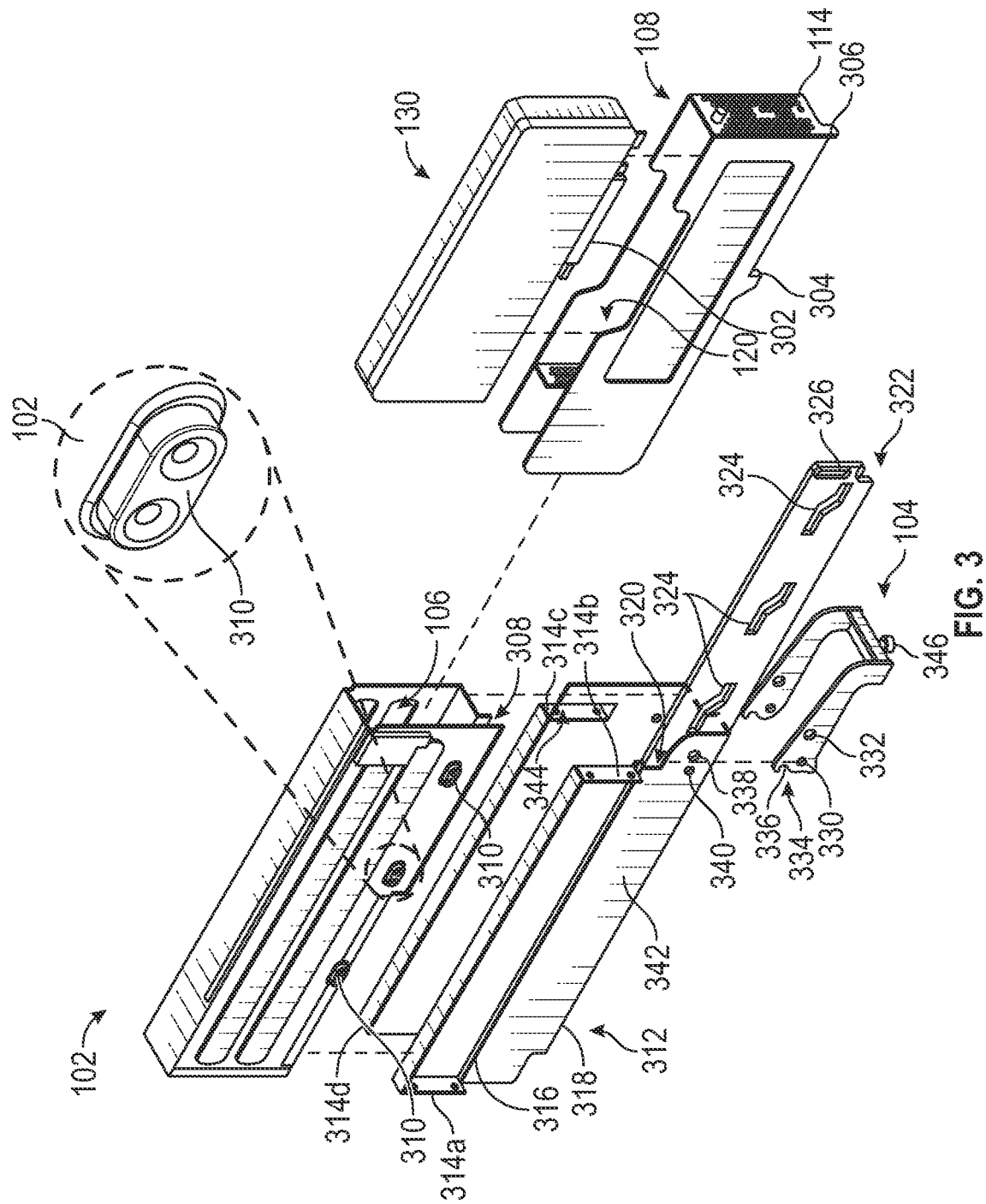
FIG. 3 is an assembly view of the embodiment of an apparatus for facilitating the service of an electronic device.

FIG. 3 is an assembly view of the embodiment of elevator mechanism 100. In FIG. 3, mechanism 100 is shown to include carrier 108, elevator housing 102, an outer housing 312, and an actuator (or "slider") 322. Electronic device 130 is shown to include connector 302. Electronic device 130 is an exemplary GPU with a PCIe connection. In embodiments, the type of connection may be changed to another type of connection that may be mated using the elevator mechanism. When device 130 is inserted into slot 120 of carrier 108, connector 302 protrudes from the base of carrier 108 between tabs 304, 306. In embodiments, tabs 304, 306 may serve to protect connector 302 on insertion or removal, and may serve as travel limiters when elevator housing 102 is lowered onto PCB 60. Connector 302 may be a "gold finger" connection.

When carrier 108 is populated and inserted into entry port 106, tab 304 and connector 302 slide within a connector slot 308 of elevator housing 102. Connector slot 308 is open from the bottom to allow connector 302 and connector 502 to mate. Elevator housing 102 further includes protrusions (or "followers") 310 on one side.

Outer housing 312 is shown to include flanges 314a . . . 314d, a lip 316, a base 318, a recess 320, a pin 338, a handle travel limit pin 340, an outer side section 342, and a window 344. Flanges 314a . . . 314d are configured to receive partitions 80 of chassis 50 and maintain outer housing 312 is the proper fore/aft position within slot 90. Recess 320 is dimensioned to receive slider 322 and is formed between lip 316, outer side section 342 and base 318. Recess 320 constrains slider 322 to fore/aft motion. Handle 104 pivots about pin 338, with the extent of the pivot being limiting by pin 340. Window 344 receives a raised section 402 (FIG. 4) of elevator housing 102. The interaction between the edges of window 344 and edges of raised section 402 constrains elevator housing 102 to linear motion with respect to outer housing 312 (which is vertical linear motion in the several views).

Slider 322 includes tracks 324 and an actuator track 326. In the embodiment, tracks 324 are slots within slider 322. Tracks 324 are further from base 318 at one end and nearer to base 318 at the other. When assembled, each follower 310 of elevator housing 102 travels within a slot 324. Raised section 402 travels within window 344. When assembled, with elevator housing 102 constrained to vertical motion by raised section 402 and window 344, movement of slider 322 rearward (to the left as shown) causes followers 310 to move within tracks 324 to the track section nearer base 318. Thus, rearward motion of slider 322 causes elevator housing 102 to be lowered toward PCB 60. Conversely, forward movement of slider 322 causes followers 310 to move within tracks 324 to the track section further from base 318. Thus, forward motion of slider 322 causes elevator housing 102 to be raised away from PCB 60. Thus, connector 302 may be mated to or disconnected from connector 502 by the fore/aft movement of slider 322. In an embodiment, the relative change in height caused by followers 310 traveling within tracks 324 may be 9 mm, an amount of travel determined sufficient to engage and disengage connectors 302, 502.

Handle 104 includes a pivot hole 330, a pin 332, a cam track 334, a cam track stop 336, and a thumb screw 346. Pivot hole 330 engages pin 338 and handle 104 rotates about pin 338. The rotation is limited by limiter pin 340 traveling within the bounds of cam track 334. When assembled, pin 332 is disposed within actuator track 326 such that rotation of handle 104 causes pin 322 to travel within actuator track 326. With handle 104 pivoting about pin 338, the rotational motion of handle 104 and the movement of pin 332 within track 326, and the constraint of slider 322 within recess 320, cause linear fore/aft motion of slider 322.

Figure 4A:
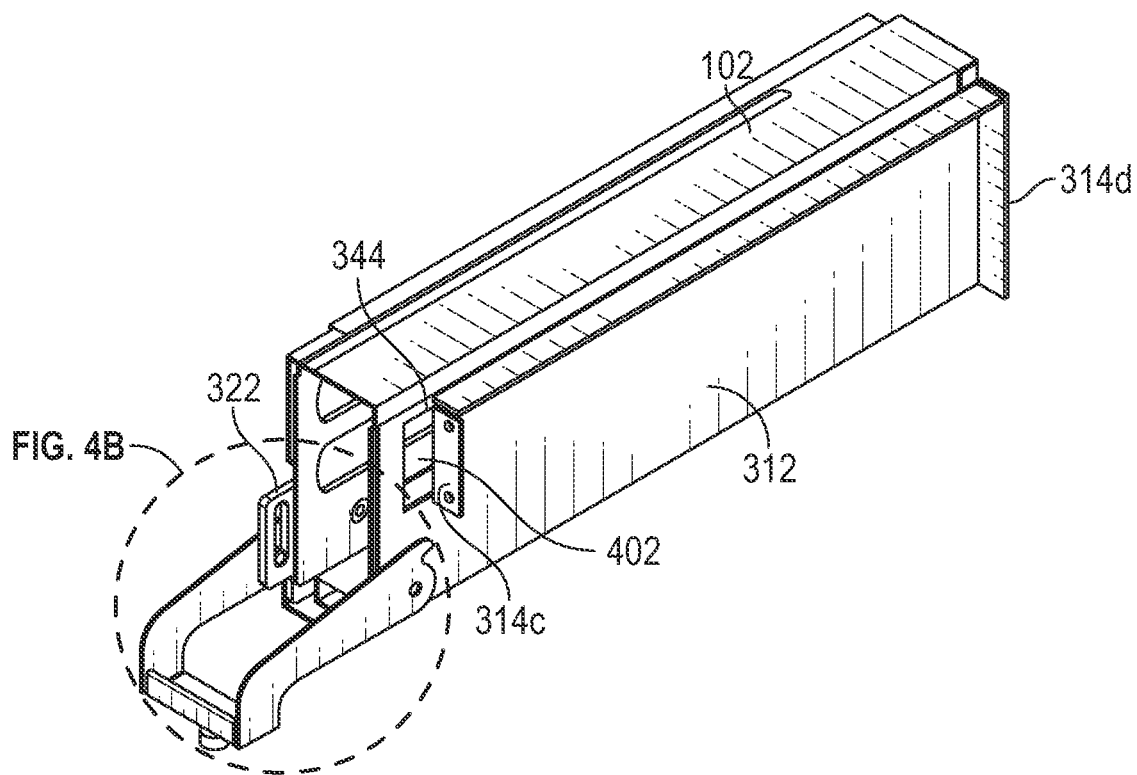
FIG. 4A is a front right perspective view illustrating the embodiment of an apparatus for facilitating the service of an electronic device.

FIG. 4A is a front right perspective view illustrating elevator mechanism 100 with elevator housing 102, handle 104, outer housing 312, and slider 322, assembled. In FIG. 4A, outer housing 312 is shown to include window 344, with raised section 402 of elevator housing 102 being received by window 344. Thus, elevator housing 102 is constrained to move vertically with respect to outer housing 312.

Figure 4B:
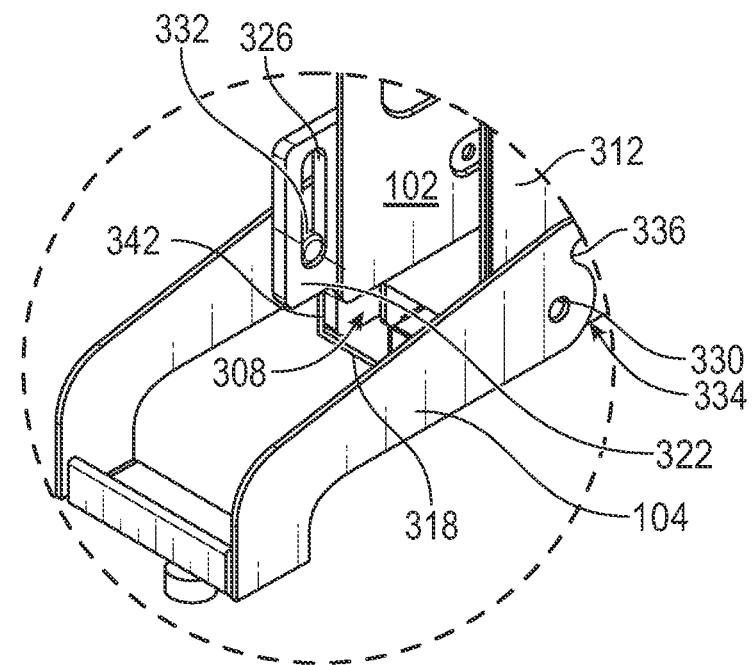
FIG. 4B further illustrates the indicated section of FIG. 4A.

FIG. 4B further illustrates the indicated section of FIG. 4A. In FIG. 4B, pin 322 of handle 104 is shown to travel within actuator track 326, causing slider 322 to move fore/aft with respect to both elevator housing 102 and outer housing 312. FIG. 4B further illustrates connector window 308 within elevator housing 102. A window 512 (FIG. 5A) within base 318 of outer housing 312 allows connector 502 (FIG. 5A) to pass through outer housing 312 and mate with connector 302.

FIG. 5A is a front left, partially transparent perspective view illustrating elevator mechanism 100. In FIG. 5A, chassis-side power connector 500 is shown connected to outer connector 206. To be connected in this manner, populated carrier 108 was inserted in direction 506 into elevator housing 102, forcing connector 206 through a window at the rear of housing 102 and into connector 500. FIG. 5A further illustrates the relationship between device connector 302 and board connector 502, which is extended upward through window 512 of base 318. As shown, with handle 104 open (rotated forward), elevator housing 102 is raised and connector 302 is not mated with connector 502.

Figure 5B:
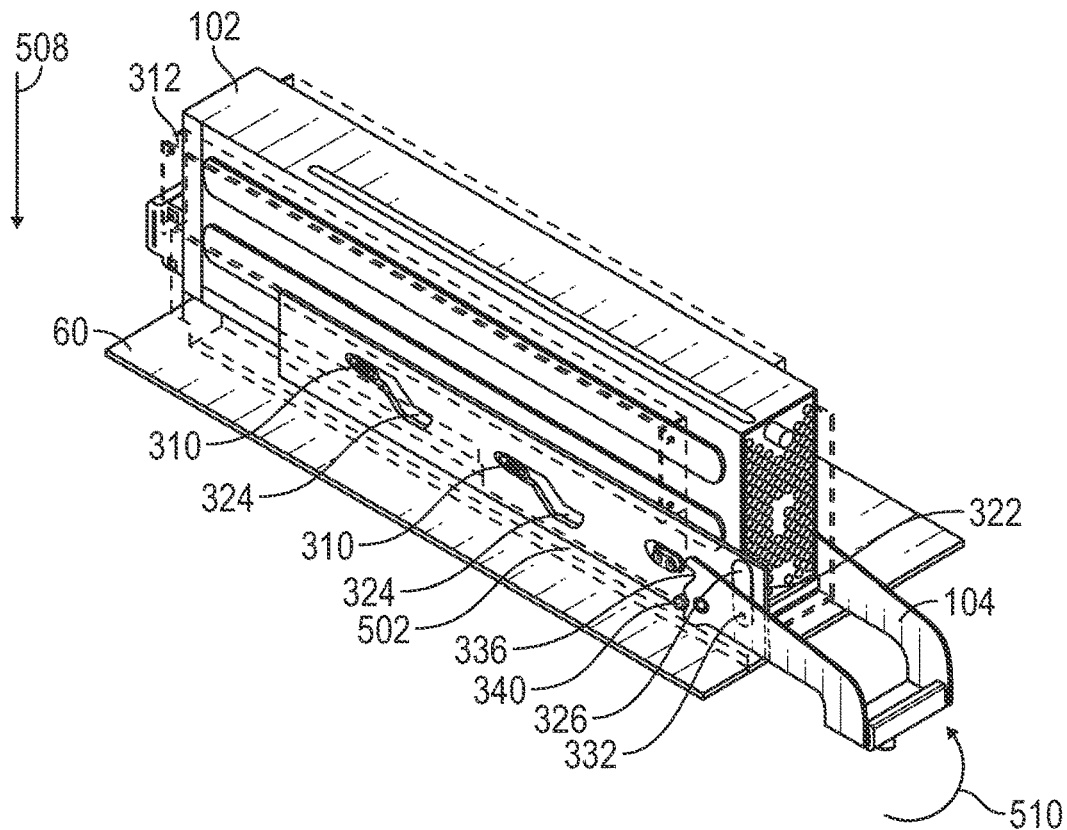
FIG. 5B is a front left, partially transparent perspective view illustrating the embodiment of an apparatus for facilitating the service of an electronic device.

FIG. 5B is a front left, partially transparent perspective view illustrating elevator mechanism 100. In FIG. 5B, handle 104 is open, and followers 310 are positioned in the upward sections of tracks 324, i.e., elevator housing 102 is raised with respect to outer housing 312. In FIG. 5B, connector 502 remains partly visible, indicating (along with the position of handle 104) that elevator housing 102 is not lowered and that connectors 302 and 502 are not connected.

Figure 5C:
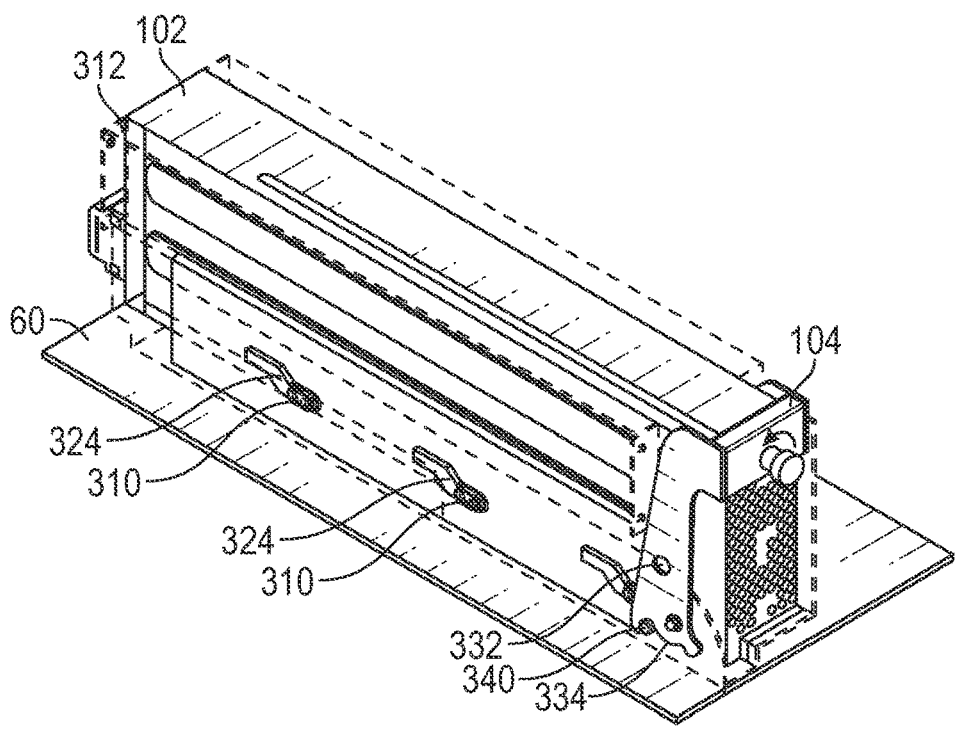
FIG. 5C is a front left, partially transparent perspective view illustrating the embodiment of an apparatus for facilitating the service of an electronic device.

FIG. 5C is a front left, partially transparent perspective view illustrating elevator mechanism 100. From the position of FIG. 5B, the completely lowered position of FIG. 5C is attained by rearward rotation 510 of handle 104 to the closed position. That rearward rotation pushes slider 322 (FIG. 3) rearward and causes tracks 324 to move rearward. Followers 310, in following tracks 324, move from the elevated sections of tracks 324 (as shown in FIG. 5B) to the lower sections of tracks 324 (as shown in FIG. 5C). The downward movement of followers 310 in turn lowers elevator housing 102 straight down 508 toward base board 60. This causes connector 302 to be inserted into connector 502. The travel of handle 104 is limited by limited pin 340 within cam track 336. Handle 104 may be retained in the upward, closed position by thumbscrew 346 engaging socket 504.

Figure 6A:
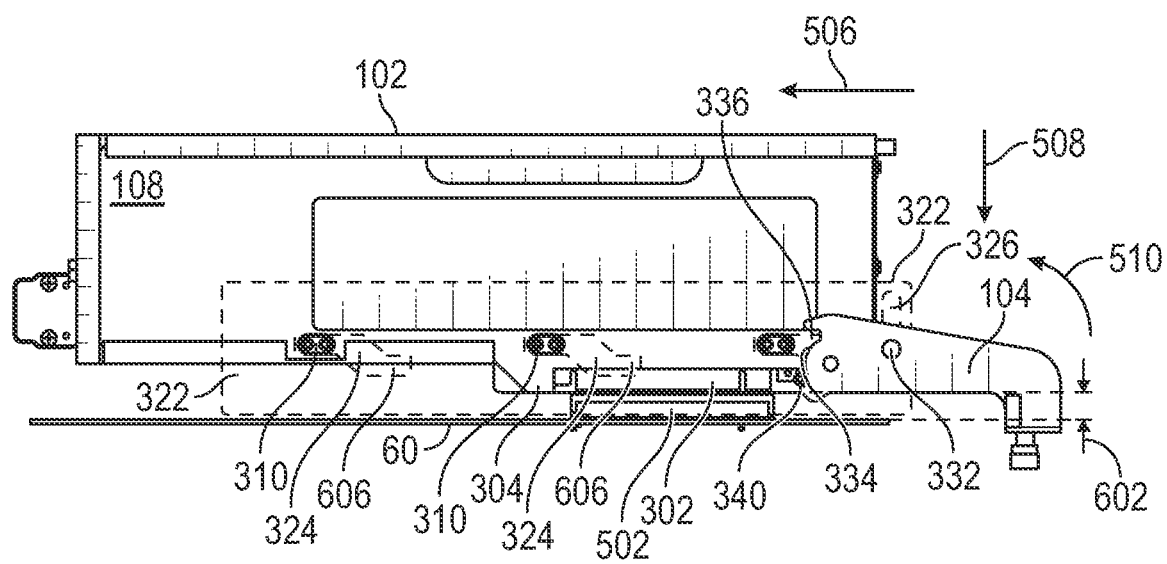
FIG. 6A is a left side, partially transparent view illustrating the embodiment of an apparatus for facilitating the service of an electronic device.
Figure 6B:
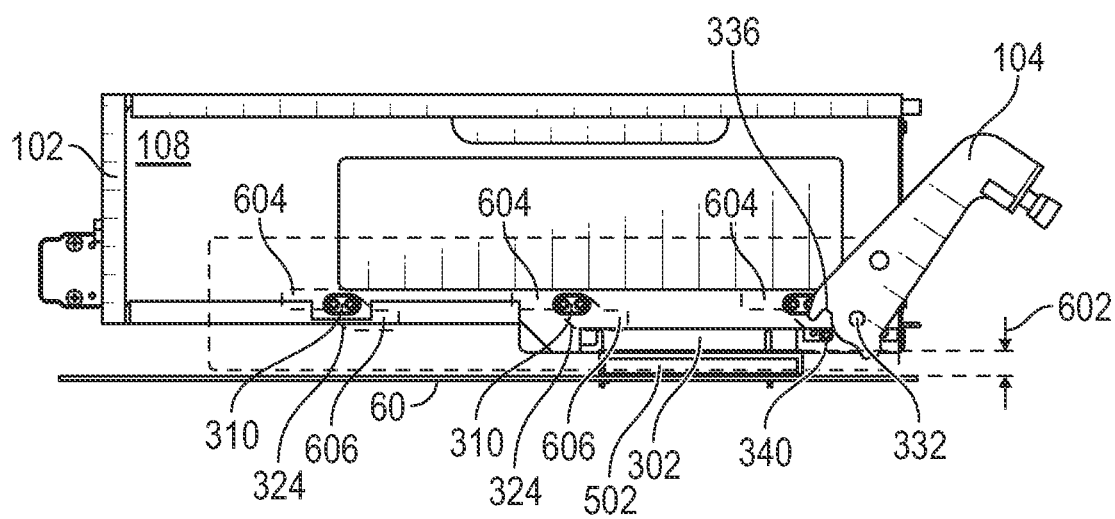
FIG. 6B is a left side, partially transparent view illustrating the embodiment of an apparatus for facilitating the service of an electronic device.

FIG. 6A is a left side, partially transparent view illustrating elevator mechanism 100. In FIG. 6A, handle 104 is in the open position and slider 322 is in the forward position with pin 332 within actuator track 326. Slider 322 is forward with respect to both elevator housing 102 and outer housing 312. Followers 310 within tracks 324 are positioned in elevated sections 604 (FIG. 6B). Connector 302 is shown disconnected at a distance 602 from PCB 60. In this position, when carrier 108 is drawn forward (the reverse of direction 506), connector 302 will not be hindered and carrier 108 may be completely removed from elevator housing 102. In an embodiment, the travel 602 between raised sections 604 and lowered sections 606 is 9 mm, which is determined sufficient to engage and disengage connectors 302 and 502.

FIG. 6B is a left side, partially transparent illustrating elevator mechanism 100. In FIG. 6B, handle 104 has been partially rotated closed. The rotation has pushed slider 322 rearward 506 relative to connector 502, elevator housing 102, and followers 310. The motion of slider 322 has moved tracks 324 rearward 506 so that followers 310 are positioned between elevated sections 604 and lowered sections 606. The motion of followers 310 within tracks 324 has caused a right, upper edge of follower 310 to contact a slanted, upper section of track 324. That contact and subsequent relative motion between track 324 and follower 310 has pushed follower 310 down 508 slightly, which in turn has pulled elevator housing 102 down slightly as well.

Figure 6C:
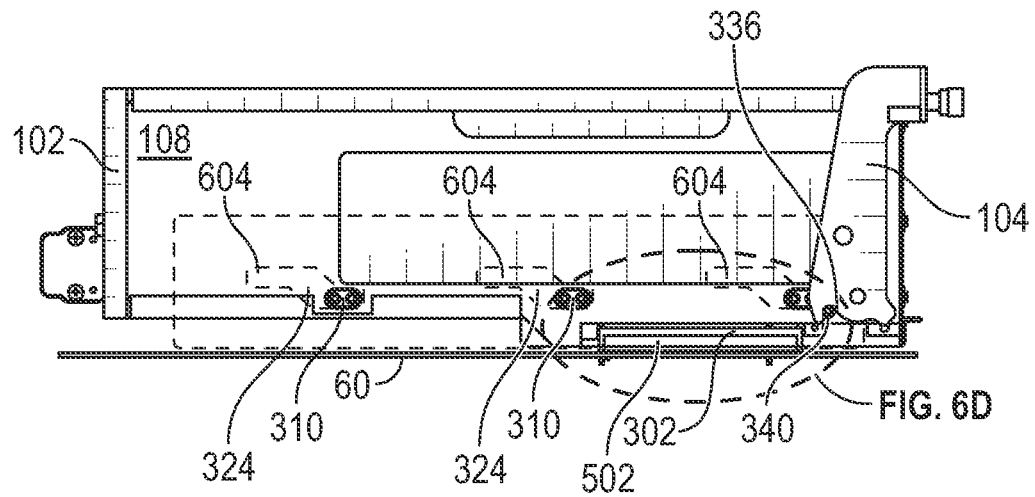
FIG. 6C is a left side, partially transparent view illustrating the embodiment of an apparatus for facilitating the service of an electronic device.

FIG. 6C is a left side, partially transparent view illustrating elevator mechanism 100. In FIG. 6C, handle 104 has been completely closed, as indicated by limiter pin 340 being positioned at track stop 336. The completed rotation has pushed slider 322 fully rearward 506, moving tracks 324 rearward 506 so that followers 310 are positioned at lowered sections 606. The motion of followers 310 within tracks 324 has caused followers 310 to travel from upper section 604 to lowered sections 606, which in turn has pulled elevator housing 102 fully down 508 and connector 302 to mate with connector 502.

Figure 6D:
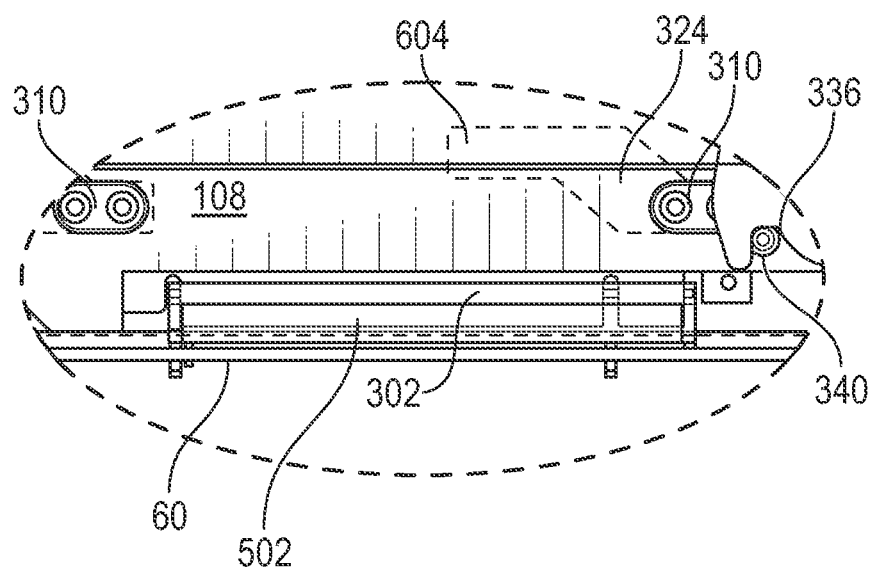
FIG. 6D is a left side, partially transparent view of the section indicated in FIG. 6C.

FIG. 6D is a left side, partially transparent view of the section indicated in FIG. 6C. In FIG. 6D, connector 302 of electronic device 130 is shown fully connected to connector 502 of base board 60.

In an embodiment, the elements of housing 312 may be incorporated directly into the sides of a slot of an expansion chassis, such that handle 104 pivots about a section of the chassis slot and slider 322 moves with respect to the slot. In an embodiment, the relative positions of followers 310 and tracks 324 may be reversed. That is, followers 310 may be provided on slider 322 and tracks 324 may be provided in elevator housing 102. In an embodiment, track 324 may be a raised track with followers 310 configured to travel along a raised track, e.g., follower 310 may be "U"-shaped with raised track 324 fitting within the "U." In an embodiment, slider 322 may be associated with elevator housing 102 such that slider 322 travels up and down with the motion of elevator housing 102 with respect to outer housing 318. That is embodiments are not limited to the illustrated configuration of slider, track, and follower. In an embodiment, the actuator/slider may be associated with the elevator housing, with the horizontal movement of the actuator causing both the elevator housing and the actuator to rise/drop. In an embodiment, the actuation of slider 322 provided by the rotation of handle 104 may be provided by other means, e.g., by a lever. In an embodiment, followers 310 may follow vertical tracks and the rotation of handle 104 may be transmitted by cords attached to each follower 310, upper cords drawing the follower upward or downward cords drawing the follower downward according to the handle rotation. In an embodiment, the actuation of slider 322 may be performed manually by the user. In an embodiment, a spring may bias elevator 102 to the raised, disconnected position. In an embodiment, a spring may bias elevator 102 to the lowered, connected position.

The following includes enumerated embodiments.

Embodiment 1 is an apparatus comprising: a slot including a first side and a second side, the first side extending from a base; an inner housing received between the first side and the second side and dimensioned to receive an electronic device; an actuator provided between the inner housing and the first side and moveable with respect to the inner housing and the first side between a first actuator position and a second actuator position; a first track including a first track position and a second track position, the first track position being further from the base than a second track position; and a first track follower engaging the first track and movable along the first track between the first track position and the second track position, wherein: the first track is associated with one of the actuator or the inner housing and the first track follower is associated with the other of the actuator or the inner housing; with the actuator in the first actuator position, the first track follower is positioned at the first track position; and movement of the actuator from the first actuator position to the second actuator position causes the first track follower to move along the first track to the second track position and the inner housing to move linearly a first distance toward the base.

Embodiment 2 includes the apparatus of embodiment 1, wherein the inner housing includes a first window dimensioned to admit a first connector, and wherein, when the inner housing is populated with the electronic device, movement of the inner housing the first distance toward the base is sufficient to connect the electronic device to the first connector.

Embodiment 3 includes the apparatus of embodiment 2, further including an outer housing that includes the slot, the first side, the second side, and the base, the base being provided with a second window dimensioned to admit the first connector.

Embodiment 4 includes the apparatus of embodiment 1, wherein the first side or the second side includes a third window oriented perpendicularly to the base and the inner housing includes a raised section configured to move within the second window such that relative movement between the inner housing and the second window is constrained to movement of the inner housing toward or from the base.

Embodiment 5 includes the apparatus of embodiment 1: wherein the actuator includes a flat member configured to slide between the first side and the inner housing; wherein the first track includes a first slot disposed in the actuator, the first slot including the first track position and second track position; wherein the first track follower includes a first protrusion from the inner housing; and wherein the with the actuator in the first actuator position, the first track follower is at the first track position; and movement of the actuator from the first actuator position to the second actuator position causes the first track follower to move along the first track to the second track position and the inner housing to move a first distance linearly toward the base, includes: with the actuator in the first actuator position, the first protrusion is at the first track position and the inner housing is at the first distance from the base; and movement of the actuator from the first actuator position to the second actuator position causes the first protrusion to move along the first slot to the second track position and the inner housing to move the first distance linearly toward the base.

Embodiment 6 includes the apparatus of embodiment 5 further including: a second slot disposed in the actuator and including a third track position and a fourth track position; and a second protrusion from the inner housing and dimensioned to move along the second slot between the third track position and the fourth track position, wherein: with the actuator in the first actuator position, the second protrusion is at the third track position and the inner housing is at the first distance from the base; and movement of the actuator from the first actuator position to the second actuator position causes the second protrusion to move along the second slot to the fourth track position and the inner housing to move the first distance linearly toward the base.

Embodiment 7 includes the apparatus of embodiment 1: wherein the actuator includes a flat member configured to slide between the first side and the inner housing; wherein the first track includes a third slot disposed in the inner housing, the third slot including the first track position and second track position; wherein the first track follower includes a third protrusion from the actuator; and wherein the with the actuator in the first actuator position, the first track follower is at the first track position; and movement of the actuator from the first actuator position to the second actuator position causes the first track follower to move along the first track to the second track position and the inner housing to move the first distance linearly toward the base, includes: with the actuator in the first actuator position, the third protrusion is at the first track position and the inner housing is at the first distance from the base; and movement of the actuator from the first actuator position to the second actuator position causes the third protrusion to move along the third slot to the second track position and the inner housing to move the first distance linearly toward the base.

Embodiment 8 includes the apparatus of embodiment 7 further including: a fourth slot disposed in the actuator and including a fifth track position and a sixth track position; and a fourth protrusion from the inner housing and dimensioned to move along the fourth slot between the fifth track position and the sixth track position, wherein: with the actuator in the first actuator position, the fourth protrusion is at the fifth track position and the inner housing is at the first distance from the base; and movement of the actuator from the first actuator position to the second actuator position causes the fourth protrusion to move along the fourth slot to the sixth track position and the inner housing to move the first distance linearly toward the base.

Embodiment 9 includes the apparatus of embodiment 1 further including a lever attached to the first side, pivotable about an axis, and including an extension in a direction of the axis, wherein: the extension is received by a fifth slot disposed in the actuator and oriented such that rotation of the lever causes the actuator to move linearly between the first actuator position and the second actuator position.

Embodiment 10 includes the apparatus of embodiment 1 further including a carrier: dimensioned to receive an electronic device; dimensioned to be received within the inner housing; and including a second connector for connecting the electronic device to a chassis.

Embodiment 11 includes the apparatus of embodiment 1, wherein actuator movement relative the first side is constrained to movement that is parallel to the base.

Embodiment 12 includes the apparatus of embodiment 1, wherein actuator movement relative to the inner housing is constrained to movement that is parallel to the base.

In embodiments described with reference to FIG. 7, et seq., a low-profile apparatus facilitates the service of an electronic device. The embodiment provides a design that allows for the direct front service of electronic devices, e.g., PCIE cards, that lay horizontally in a chassis, e.g., a 1U chassis. Similar to the embodiments discussed with regard to FIG. 1-FIG. 6D, the embodiment facilitates the service of a single electronic device (electronic device 130, which may be a GPU/PCIE card) without requiring that another electronic device be removed from a chassis (e.g., chassis 828, FIG. 8), or that an entire chassis be removed from a rack just to service the single electronic device.

Full front service of, e.g., a PCIE card, involves a 3-step process. First, the PCIE card must be ejected from the connector; second, the bad card is extracted and replaced with a working PCIE card; and third, the PCIE card is installed into the connector and secured in place. In embodiments, a mechanism performs these actions for an electronic device that lays horizontally, e.g., a double width GPU/PCIE card within a 1U chassis space. The embodiments incorporate a 'C' channel mounted directly to the electronic device, e.g., a GPU. The C-channel constrains movement of the GPU with respect to a guide bar to linear, horizontal movement. The guide bar may be a rigid die-cast or plastic piece. The guide bar thus constrains the GPU to a single degree of freedom (DOF). The guide bar includes cam followers with pins that seat inside cam tracks within a slider. The slider may also be a rigid die-cast or plastic piece. The slider itself has a single DOF-it is limited to linear movement that is orthogonal to the movement of the guide bar. The slider and the guide bar are collectively an elevator mechanism in the same sense as described previously. The slider is controlled by the handle, which rotates relative to an outer cage. The rotary motion of the handle may be converted to linear reciprocating motion of the slider, i.e., when the handle is rotated anticlockwise it pulls the slider out, which in turn pulls the guide bar (and attached GPU, collectively the carrier) away from the chassis connection. With the GPU disconnected from the chassis connection, the GPU carrier may be extracted from the elevator mechanism from the front of the chassis. The guide bar and slider cooperate to function as an "elevator" in the same sense described previously. The guide bar guides the carrier (with GPU) as the carrier is slid into the proper position within the 1U space so that subsequent movement of the slider causes the guide bar to force the carrier toward the chassis connector and complete the connection to the GPU.

Thus, embodiments support the front service of a double-width GPU/PCIE card in a 1U space without requiring that another GPU/PCIE card in the chassis (e.g., chassis 828, FIG. 8), be removed. Further advantages of the embodiment of FIG. 7-FIG. 13B include: a carrier and elevator mechanism with a low profile; a relatively easier method for extracting a card for service; the adaptation of the elevator mechanism horizontal cards; easy access to PCIE cards; a reduction in service time; an ability for the same mechanism to be adapted to multiple servers in a data center.

Figure 7:
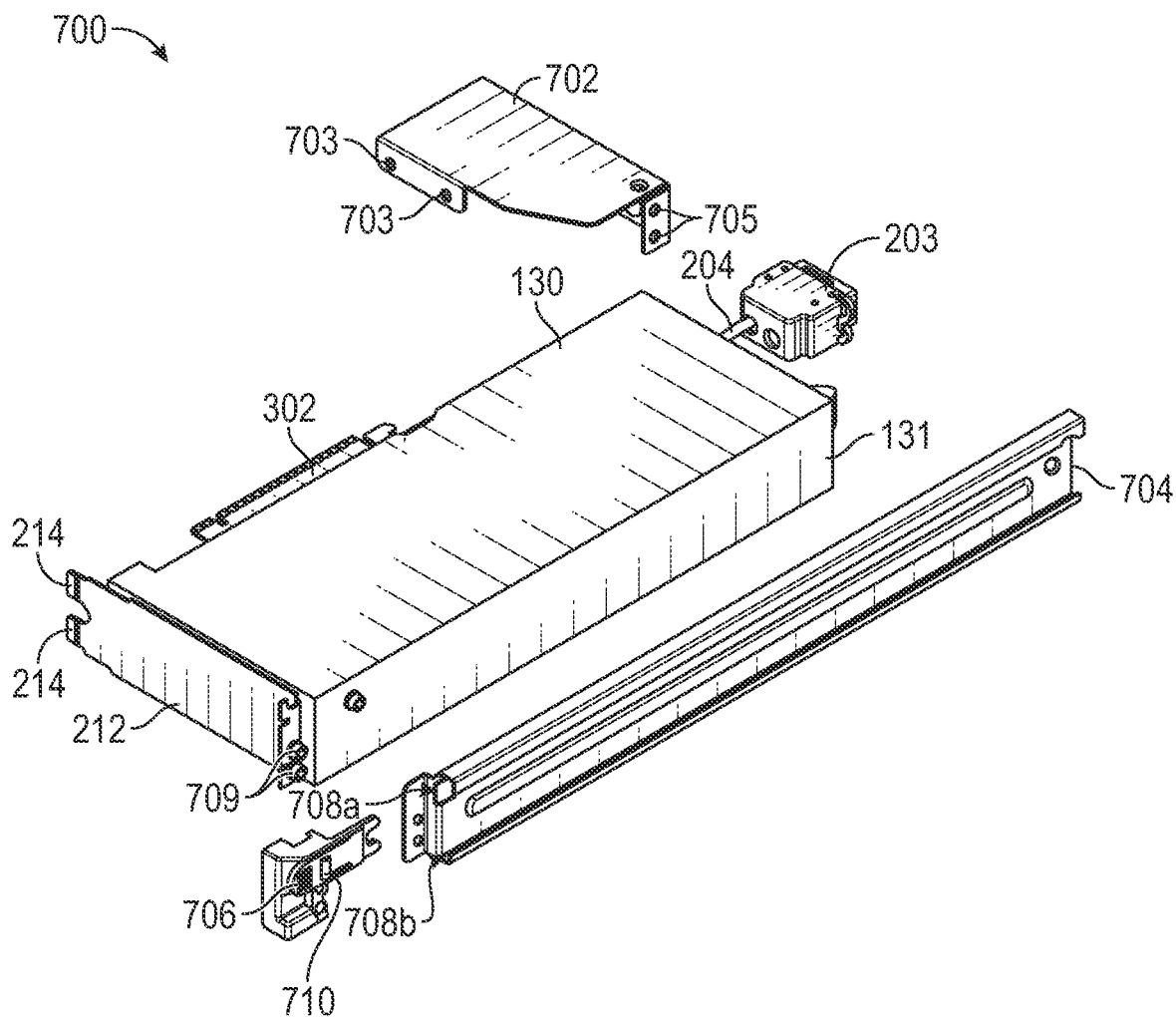
FIG. 7 is an upper front right perspective view of elements of an embodiment of a low-profile apparatus for facilitating the service of an electronic device.

FIG. 7 is an upper front right perspective view of elements of an embodiment of a low-profile apparatus for facilitating the service of an electronic device. In FIG. 7, a carrier 700 is used to facilitate the lateral connection of connector 302 of electronic component 130 (e.g., a GPU with a PCIe-compatible connection) with a chassis connector 830 (FIG. 8, which are similar to connectors 502 (FIG. 5A) in being connected to a motherboard of the chassis). Carrier 700 includes a C-channel 704, a connector bracket 702, and a latch 706. C-channel 704 includes grooves 708a, 708b along the length of C-channel 704 and is attached at GPU side 131 of component 130. At one end, C-channel 704 is attached to connector holes 709 within end bracket 212, and attached to latch 706, which has a latch tooth 710. At the opposite end, C-channel 704 is attached to a connector bracket 702 at connector holes 705. Connector bracket 702 is attached to device 130 using connector holes 703. Beneath connector bracket 702 (and obscured in this figure), wiring 204 is connected to device 130 and ends with connector 203, which is disposed in a window of bracket 702 (see FIG. 9).

Figure 8:
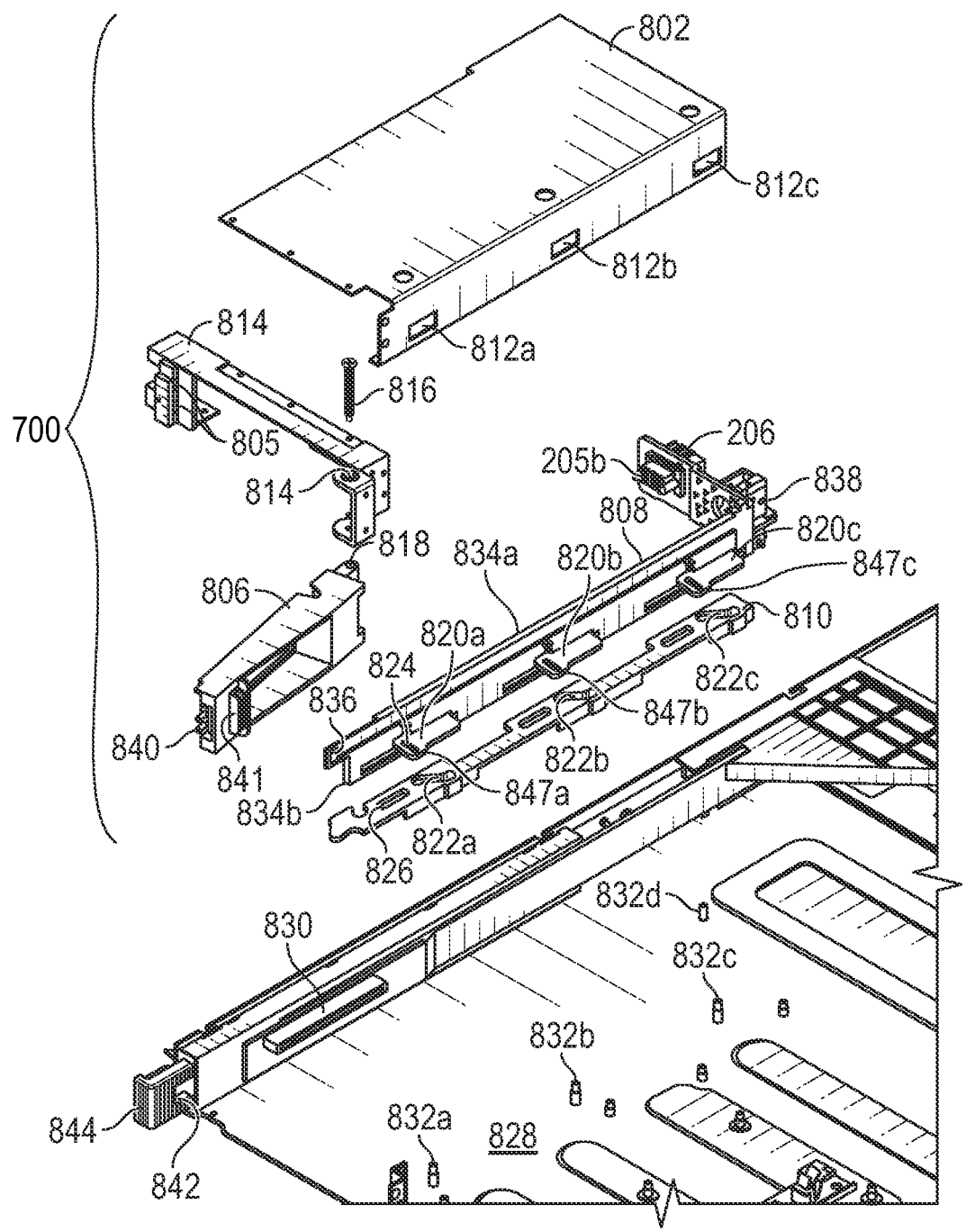
FIG. 8 is an upper front right assembly view of elements of the embodiment of a low-profile apparatus for facilitating the service of an electronic device.

FIG. 8 is an upper front right assembly view of elements of the embodiment of a low-profile apparatus for facilitating the service of an electronic device. FIG. 8 illustrates an elevator mechanism 800, which cooperates with carrier 700 to move device 130 with respect to a chassis 828 such that connector 302 (FIG. 7) mates to connector 830. In FIG. 8, elevator mechanism 800 is shown to further include an outer cage 802, a guide bar 808, a slider 810, a handle 806, and handle seat 813.

Outer cage 802 is configured to accommodate device 130, C-channel 704, guide bar 808, and slider 810 within it. Cage 802 is connected to chassis 828 by pins 832a-832c, which are received by tracks 826 of slider 810 and also by tracks 824 of guide bar 808. holes (not shown) within a lower flange extending from case base 803. Pins 832a-832c fix case 802 in place with respect to chassis 828. Cage 802 includes slots 812a-812c, which accept heads 847a-847c of cam followers 827a-827c with movement of guide bar 808 away from connector 830.

Handle 806 pivots about a pivot point 818, a pin 816, and holes 814 to rest against seat 814. Handle 806 includes a latch tooth 840 (moveable using latch tab 841), which engages a window 842 of a latch striker 844 of chassis 828, to fix handle 806 in place. Handle seat 813 includes slots 805, which accept tabs 214 of end bracket 212. Handle 806 is connected to slider 810 such that rotation of handle 806 about pivot point 808 causes linear motion of slider 810.

Slider 810 includes cam tracks 822a-822c and tracks 826. Slider 810 is caused to travel parallel to case base 803 by the rotation of lever 806. When lever 806 is closed against seat 814, slider 810 travels further into chassis 828, and when lever 806 is opened from seat 814, slider 810 is partially withdrawn from chassis 828. Cam tracks 822a-822c include sections arranged diagonally across the elongated slider such that one end of each track 822 is closer to connection 830 and the other end is further away. Tracks 822a-822c receive within them follower pins (or other suitable protrusion) 850a-850c (FIG. 16A, FIG. 16B) attached to the obscured side of cam followers 820a-820c of guide bar 808.

Guide bar 808 is caused to travel perpendicularly to and from case base 803 by follower pins 850a-850c attached to cam followers 820a-820c and the movement of those pins 850a-850c within tracks 822a-822c, that movement itself being caused by motion of slider 810 that is parallel to case base 803. Guide bar 808 also includes cam follower tracks 824. Edges 834a, 834b of guide bar 808 fit within grooves 708a, 708b of C-channel 704. An intrusion switch 838 is configured to accept a switch depressor 902 (FIG. 9) to create a signal indicating the presence of a connected device 130.

C-channel 704 and the apparatus of FIG. 7 may be slid within cage 802 and along guide bar 808 until connector 205a (FIG. 9) mates with a connector 205b of guide bar 808. A slot 836 in guide bar 808 accepts tooth 710 of latch 706 when C-channel 704 has slid along edges 834a, 834b and connector 205a mated to connector 205b.

Figure 9:
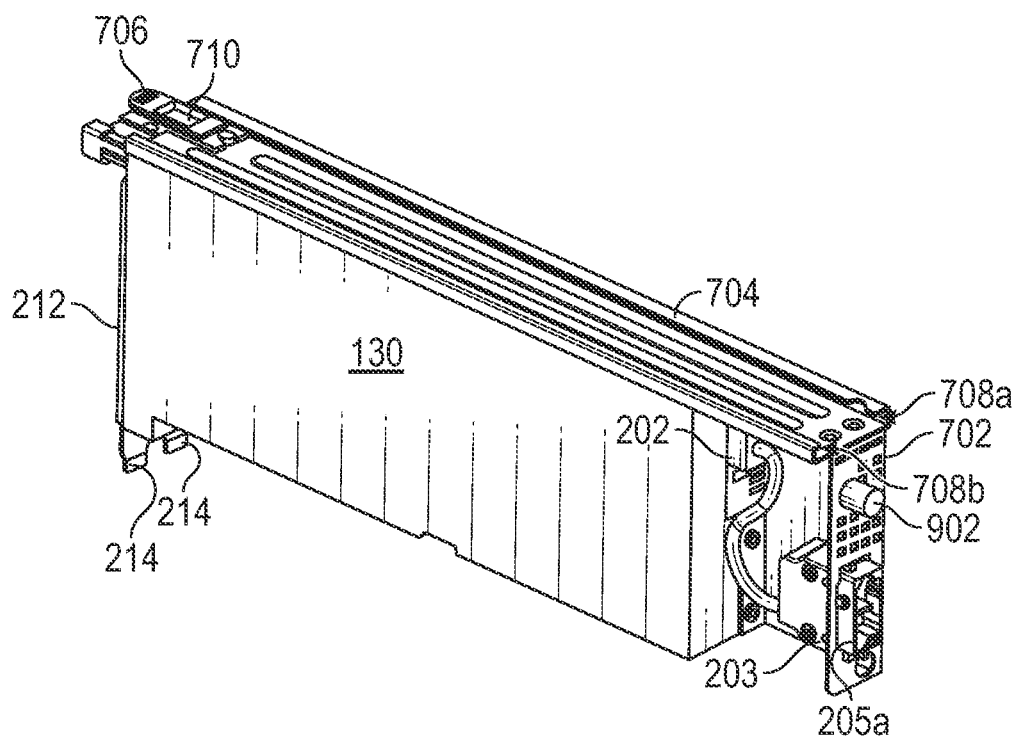
FIG. 9 is a lower rear right perspective view of elements of the embodiment of a low-profile apparatus for facilitating the service of an electronic device.

FIG. 9 is a lower rear right perspective view of elements of the embodiment of a low-profile apparatus for facilitating the service of an electronic device. In FIG. 9, carrier 700 is shown assembled, with device 130 fixed within, and from a different perspective to illustrate the connectors 202, 203, and 205a of connector bracket 702. Connector bracket 702 provides for connector 205a to be "blindly" mated to connector 205B (FIG. 10) by sliding carrier 700 within elevator mechanism along guide bar 808 until connectors 205a and 205b are mated, and switch depressor 902 is received within intrusion switch 838. The devices-side cabling for device 130 includes inner connector 202, wiring 204, connector 203, and connector 205a.

Figure 10:
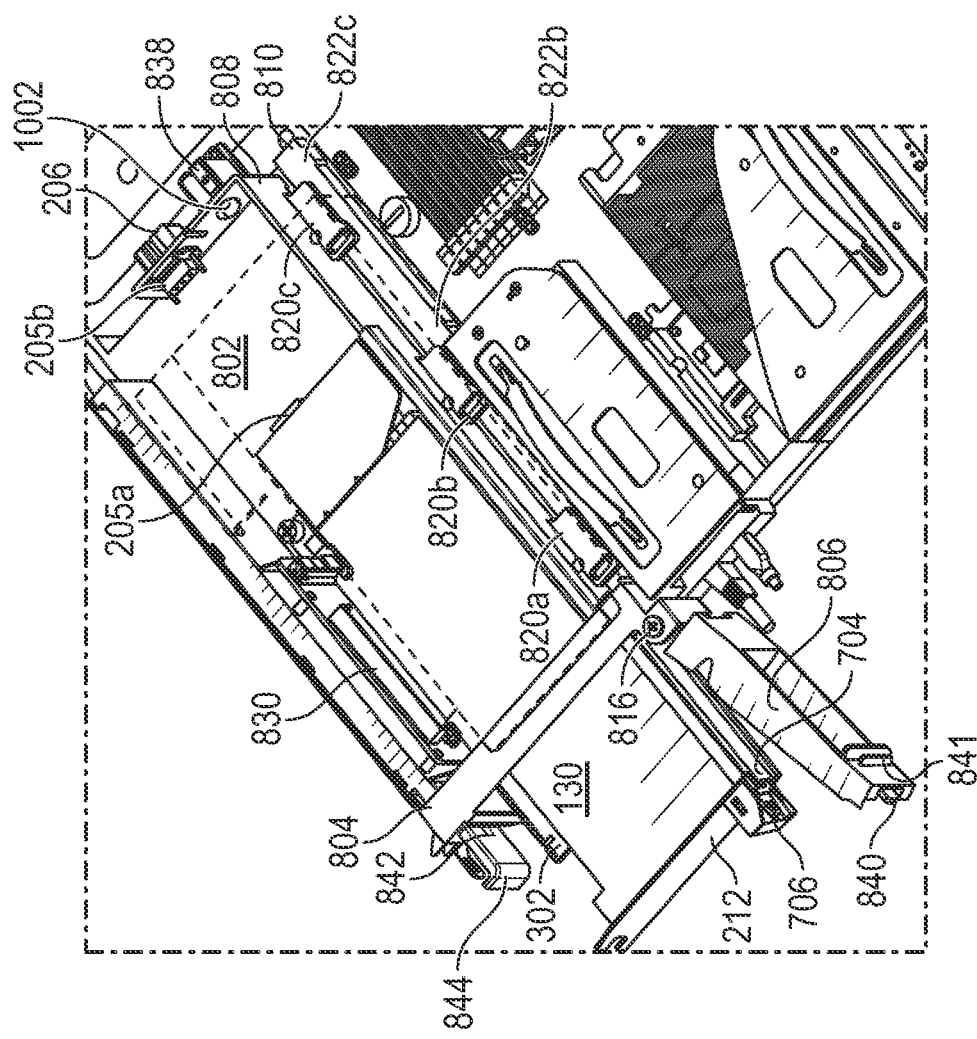
FIG. 10 is an upper front right perspective view of elements of the embodiment of a low-profile apparatus for facilitating the service of an electronic device.

FIG. 10 is an upper front right perspective view of elements of the embodiment of a low-profile apparatus for facilitating the service of an electronic device. In FIG. 10, carrier 700 has been partially installed within elevator mechanism 800, with C-channel 704 slid partially along guide bar 808. Device connector 302 is not yet positioned above chassis connector 830. And connector 205a is not yet mated with connector 205b. Device 130 is distanced from chassis connector 830, providing clearance for device connector 302 to be moved into position to be received by connector 830 with movement of carrier 700 perpendicular to and toward connector 830. An intrusion switch port 1002 indicates where switch depressor 902 will be received by intrusion switch 838.

From the position shown in FIG. 10, carrier 700 is slid into elevator mechanism 800 until connectors 205a and 205b are mated, intrusion depressor 902 is received within port 1002 and device connector 302 lines up across from chassis connector 830. At this fully-inserted point, latch 706 will be set and hold carrier 700 within elevator mechanism 800.

Figure 11:
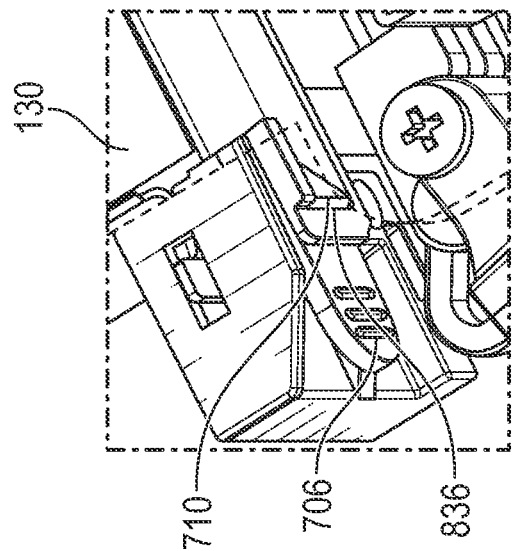
FIG. 11 is an upper front right perspective view of elements of the embodiment of a low-profile apparatus for facilitating the service of an electronic device in a second state.

FIG. 11 is an upper front right perspective view of elements of the embodiment of a low-profile apparatus for facilitating the service of an electronic device in a second fully-inserted state. FIG. 11 shows the state of latch 706 with carrier 700 fully inserted into elevator mechanism such that tooth 710 of latch 706 is received within window 836 of guide bar 808.

FIG. 12A is an upper front right perspective view of elements of the embodiment of a low-profile apparatus for facilitating the service of an electronic device in the second fully-inserted state. In FIG. 12A, outer cage 802 is rendered transparent to illustrate the interior components. In FIG. 12A, carrier 700 with device 130 within has been fully inserted in direction 1204 into elevator mechanism 800 resulting in the mating of connections 205a to 205b, and the insertion of depressor 902 into intrusion switch 838. The mating of connections 205a and 205b is made blindly, since both connectors are obscured. Device connector 302 is thereby positioned next to chassis connector 830. Because handle 806 is in the open position (indicated by position 806a) in FIG. 12A, slider 810 is relatively withdrawn from elevator mechanism 800 (in a direction opposite from direction 1204), and guide bar 808 is, as a result, positioned relatively away from chassis connector 830 (in a direction opposite from direction 1200 (FIG. 12C)).

This relationship between the position of slider 810 and guide bar 808 can be seen in FIG. 12A by the obscuring of cam follower tracks 822a-822c by cam followers 820a-820c. That is, with slider 810 pulled forward (opposite direction 1204) by handle 806, cam followers 820a-820c have been pulled away (opposite direction 1200) from connector 830 by the cam follower pins 850a-850c travelling within cam tracks 822a-822c to the section of tracks 822a-822c that is relatively further from connector 830. With slider 810 relatively forward (opposite direction 1204) of guide 808, cam followers 820a-820c largely overlap tracks 822a-822c. In FIG. 12A, position 806b (dashed) indicates the closed position of handle 806 when rotated in direction 1202.

In other words, when handle 806 moves from 806b to 806a, slider 810 moves opposite direction 1204 (FIG. 12A). Guide bar 808 and carrier 700 are not moved forward or reverse in direction 1204 by the motion of handle 806 and slider 810. The relative motion of slider 810 with respect to guide bar 808 causes the cam follower pins 850a-850c to travel within cam tracks 822a-822c. In following tracks 822a-822c, the diagonal path of the tracks causes the cam follower pins 850a-850c to travel opposite direction 1200, which in turn causes carrier 700 to move opposite direction 1200 and unseat connector 302 from connector 830.

FIG. 12B is an upper front right perspective view of the region indicated in FIG. 12A. In FIG. 12B, tab 841 is urged by a spring 846 under tension to cause tooth 840 to extend and latch within window 842 (FIG. 10) when handle 806 is in position 806b. Thus, handle 806 is retained in position 806b, which secures connector 302 to connector 830.

FIG. 12C is an upper front right perspective view of the region indicated in FIG. 12A. In FIG. 12C, direction 1200 indicates the direction of the seating motion of carrier 700 toward connector 830 that is caused by lever 806 at position 806a moving to 806b. When handle 806 moves from 806a to 806b, slider 810 moves in direction 1204 (FIG. 12A). Guide bar 808 and carrier 700 are not moved in direction 1204 by the motion of handle 806 and slider 810. The relative motion of slider 810 with respect to guide bar 808 causes the cam follower pins 850a-850c to travel within cam tracks 822a-822c. In following tracks 822a-822c, the diagonal path of the tracks causes the cam follower pins 850a-850c to travel in direction 1200, which in turn causes carrier 700 to move in direction 1200 and seat connector 302 into connector 830.

FIG. 13A and FIG. 13B are upper front right perspective views of elements of the embodiment of a low-profile apparatus for facilitating the service of an electronic device in a third state with connector 302 seated to connector 830. From the state illustrated in FIG. 13A, when handle 806 is rotated in direction 1302, slider 810 is pulled opposite direction 1204 and connector 302 is unseated from connector 830 in direction 1300, as described with reference to FIG. 12A.

Figure 14:
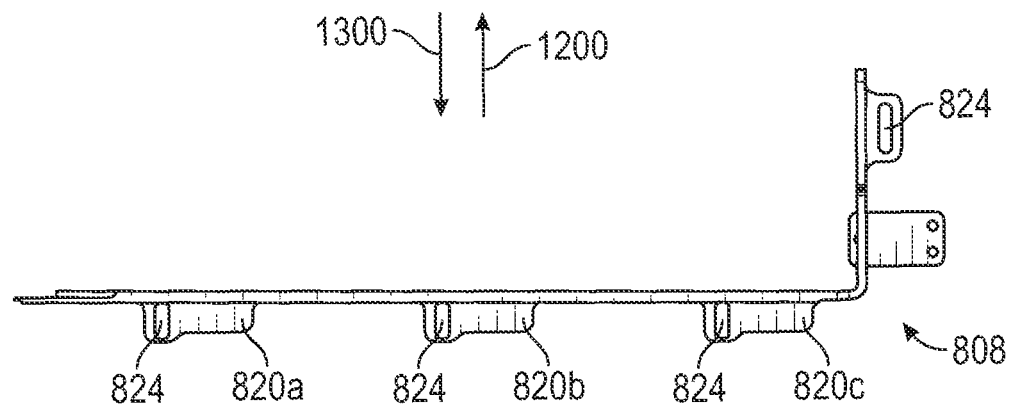
FIG. 14 is a top view of an element of an embodiment of a low-profile apparatus for facilitating the service of an electronic device.

FIG. 14 is a top view of an element of an embodiment of a low-profile apparatus for facilitating the service of an electronic device. In FIG. 14, guide bar 808 is illustrated to more clearly show tracks 824 and that they are oriented to allow motion in directions 1200, 1300.

Figure 15:
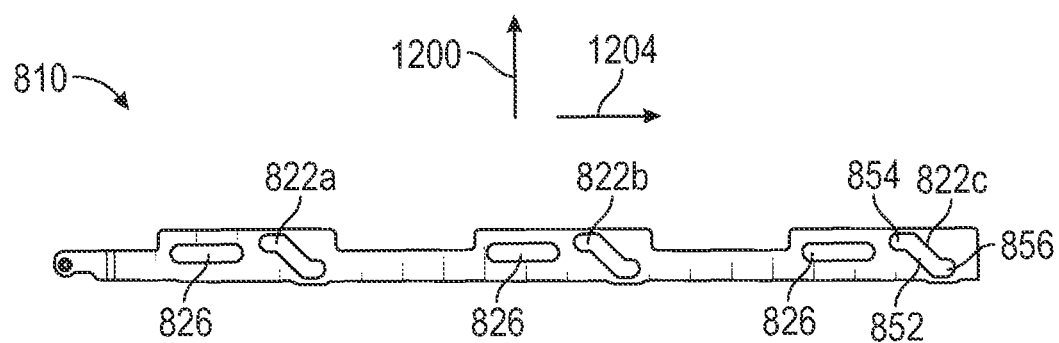
FIG. 15 is a top view of an element of an embodiment of a low-profile apparatus for facilitating the service of an electronic device.

FIG. 15 is a top view of an element of an embodiment of a low-profile apparatus for facilitating the service of an electronic device. In FIG. 15, slider 810 is illustrated to more clearly show tracks 826 and that they are oriented to allow motion in direction 1204 and the reverse. Track 822c is illustrated to include a diagonal section 852, an "inserted" end 854 and a "retracted" end 856. End 856 is designated the "retracted" end because, when pin 850c is within track 822c and at end 856, guide bar 808 has moved in direction 1300, which retracts connector 302 from connector 830. Conversely, end 854 is designated as the "inserted" end because, when slider 810 has been pushed in direction 1204 and pin 850c has followed track 822c from end 856 to end 854, guide bar 808 has moved in direction 1200, which inserts connector 302 into connector 830.

Figure 16A:
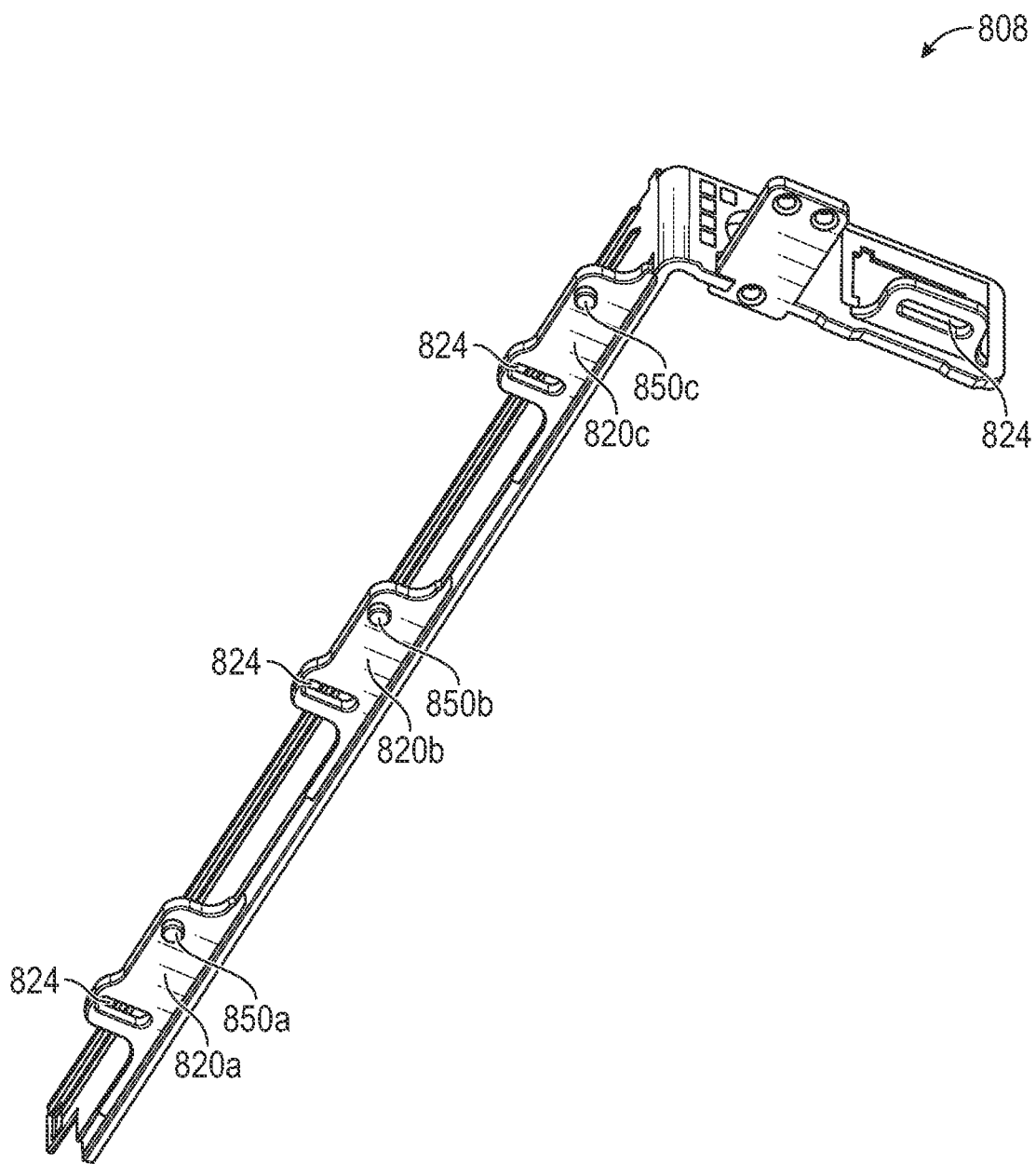
FIG. 16A is a bottom isometric view of an element of an embodiment of a low-profile apparatus for facilitating the service of an electronic device.
Figure 16B:
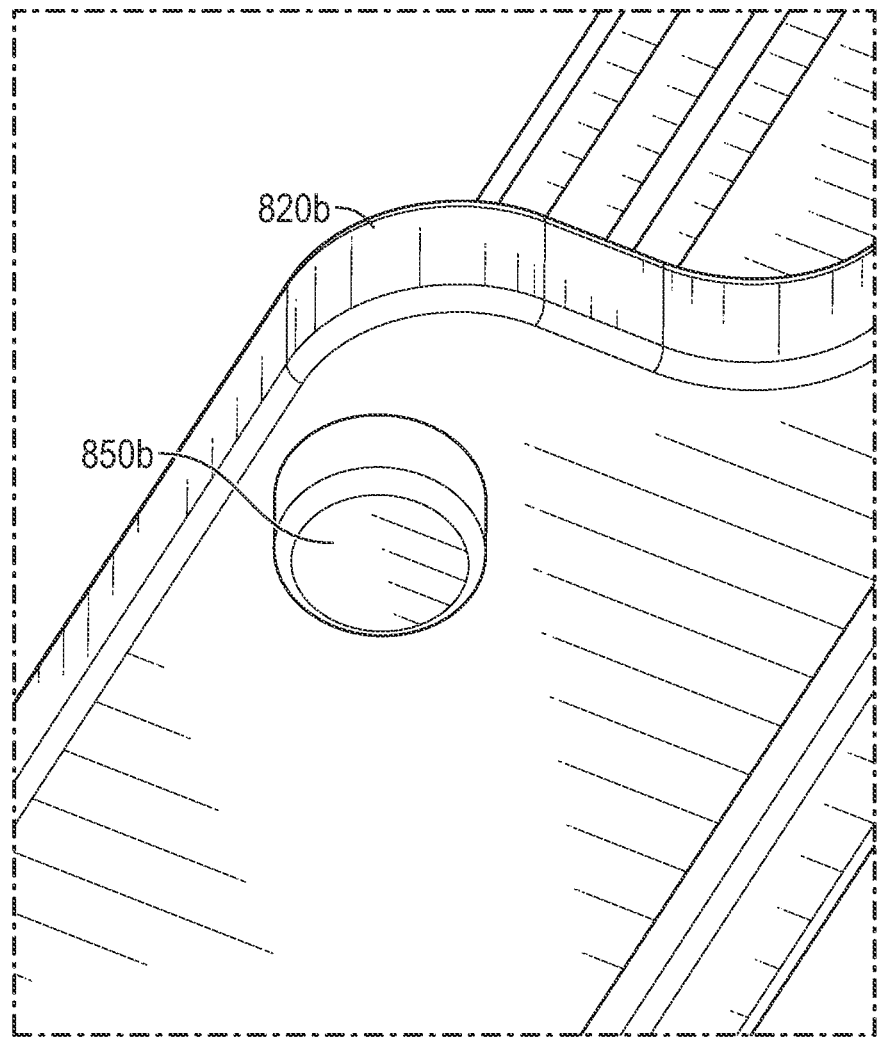
FIG. 16B is a bottom isometric view of a detail of FIG. 16A.

FIG. 16A is a bottom isometric view of an element of an embodiment of a low-profile apparatus for facilitating the service of an electronic device. FIG. 16B is a bottom isometric view of a detail of FIG. 16A. In FIG. 16A and FIG. 16B, guide bar 808 is illustrated to show the locations of cam follower pins 850a-850c of tabs 820a-820c.

Figure 17:
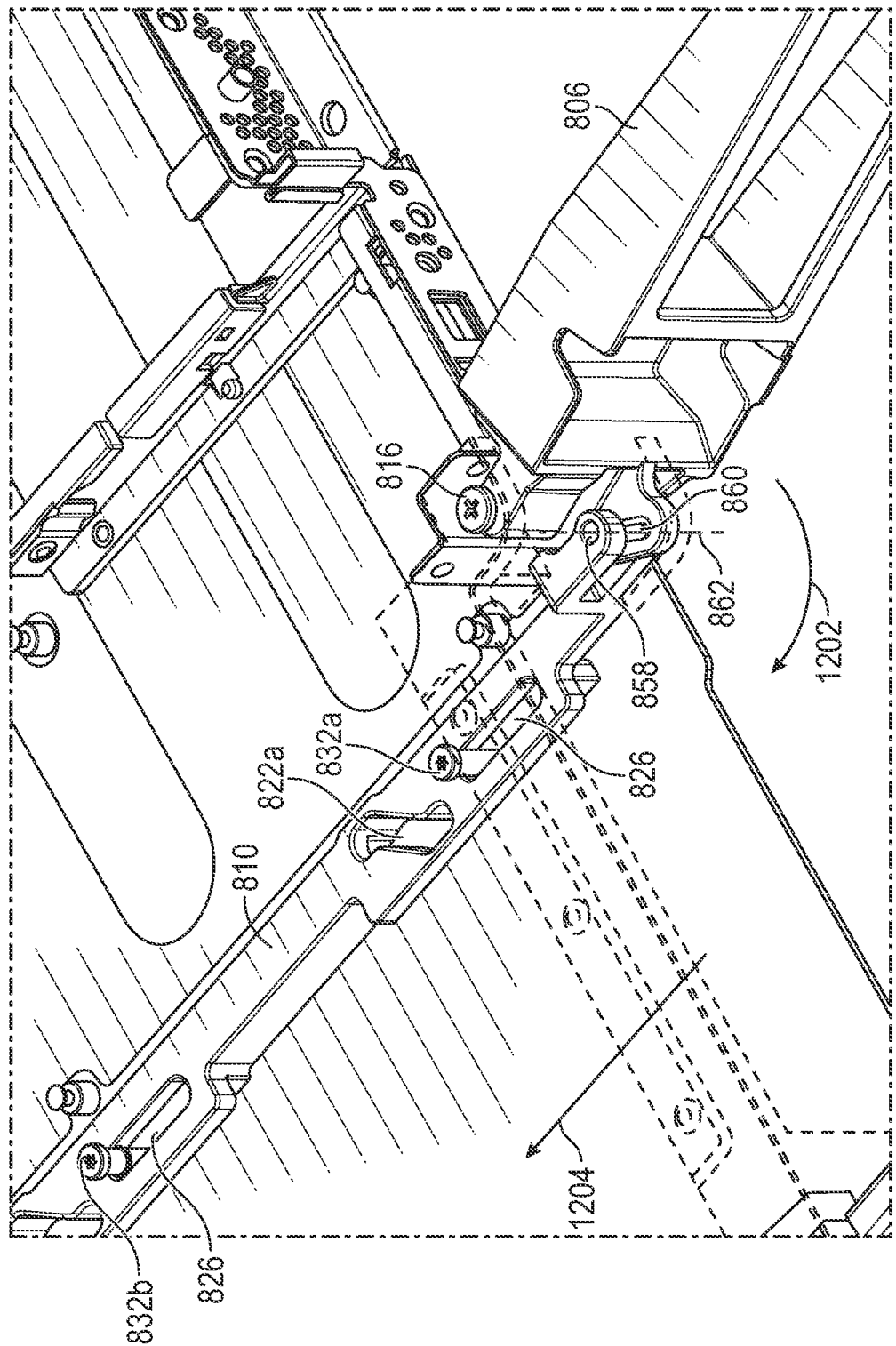
FIG. 17 is a top left isometric view 14 of aspects of an embodiment of a low-profile apparatus for facilitating the service of an electronic device.

FIG. 17 is a top left isometric view 14 of aspects of an embodiment of a low-profile apparatus for facilitating the service of an electronic device. In FIG. 17, slider 810 is shown to be moved by the force of a slot 860 in handle 806 against a pin (not shown) within holes 858 of slider 810. Rotation of handle 806 in direction 1202 is converted by the arrangement into linear motion 1204 of slider 810, which causes tracks 826 to travel in direction 1204 with respect to pins 832a-832c.

Figure 18:
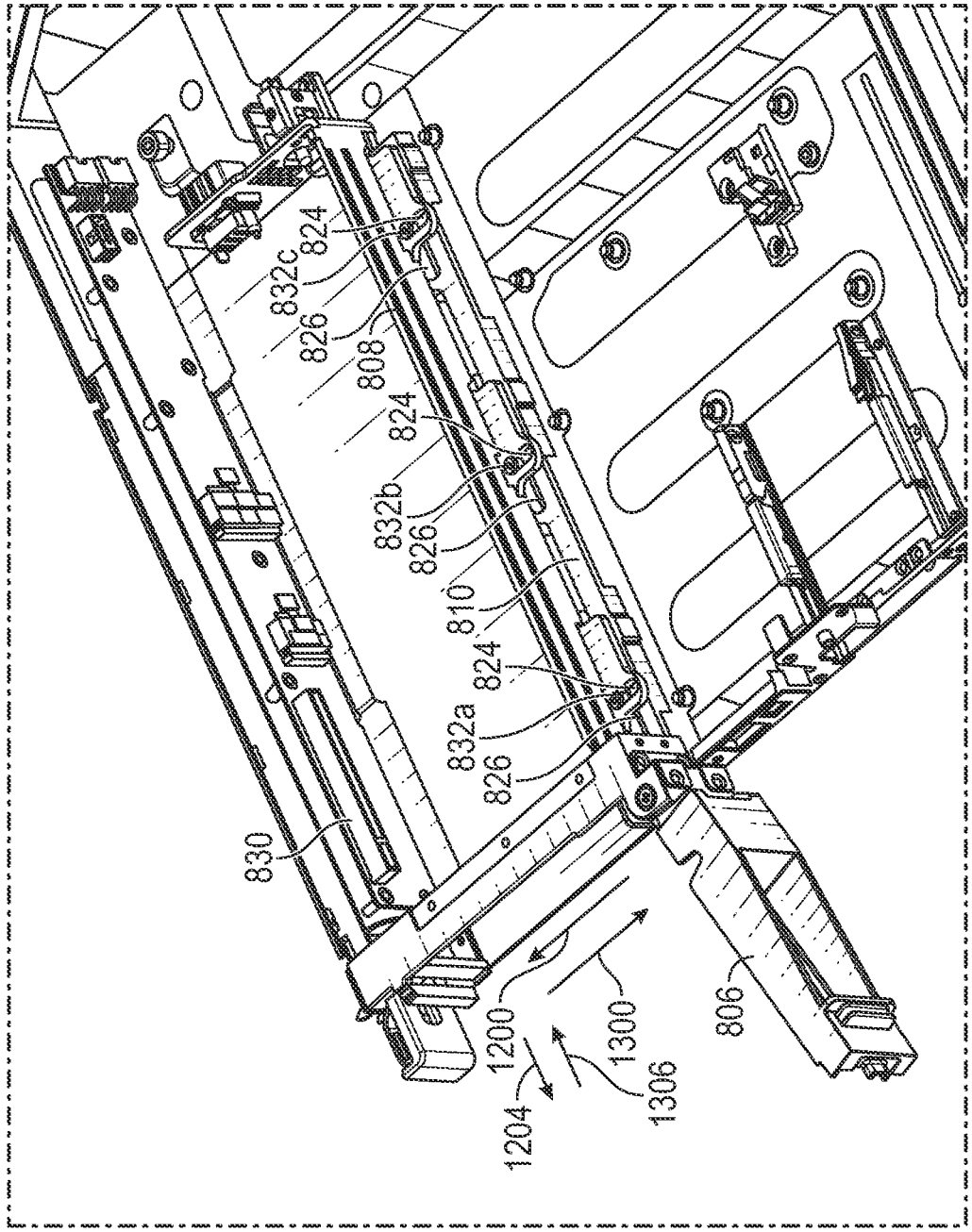
FIG. 18 is a top right isometric view of aspects of an embodiment of a low-profile apparatus for facilitating the service of an electronic device.

FIG. 18 is a top right isometric view of aspects of an embodiment of a low-profile apparatus for facilitating the service of an electronic device. In FIG. 18, pins 832a-832c are shown within tracks 824 of guide bar 808 and within tracks 826 of slider 810. Thus, pins 832a-832c constrain guide bar 808 to movement in directions 1200, 1300 and constrain slider 810 to movement in directions 1204, 1306.

Figure 19:
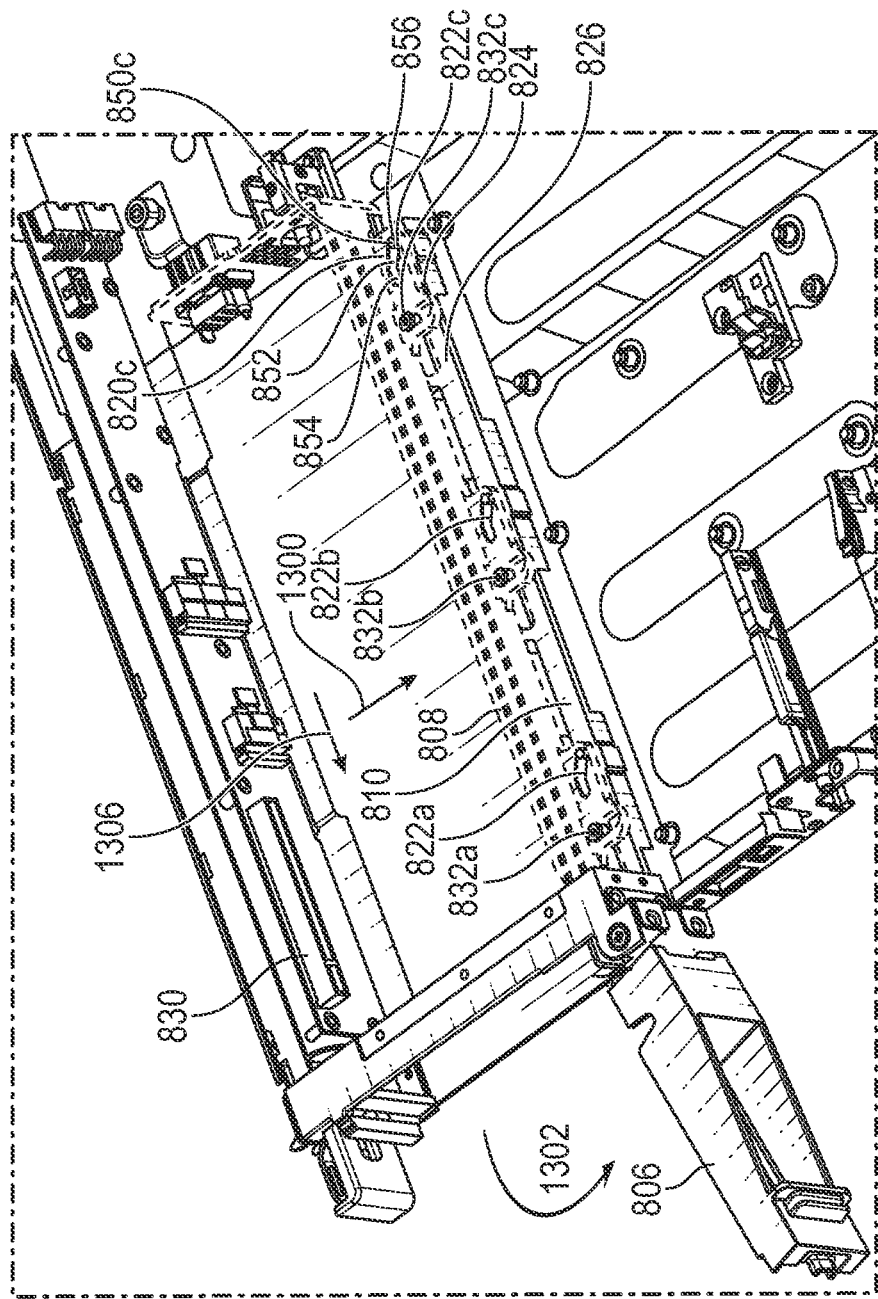
FIG. 19 is a top right isometric view of aspects of an embodiment of a low-profile apparatus for facilitating the service of an electronic device.

FIG. 19 is, like FIG. 18, a top right isometric view of aspects of an embodiment of a low-profile apparatus for facilitating the service of an electronic device. However, in FIG. 19, guide bar 808 has been rendered partially transparent to better illustrate the travel of follower pins 850a-850c within tracks 822a-822c. The following description in FIG. 19 and FIG. 20 directed to pin 850c and track 822c applies equally to pins 850a, 850b and track 822a, 822b. In FIG. 19, rotation in direction 1302 of handle 806 has drawn slider 810 in direction 1306. As a result, pin 850 has traveled to "retracted" end 856 of track 822c, positioning guide bar 808 and device 130 (when present) furthest in direction 1300 from connector 830.

Figure 20:
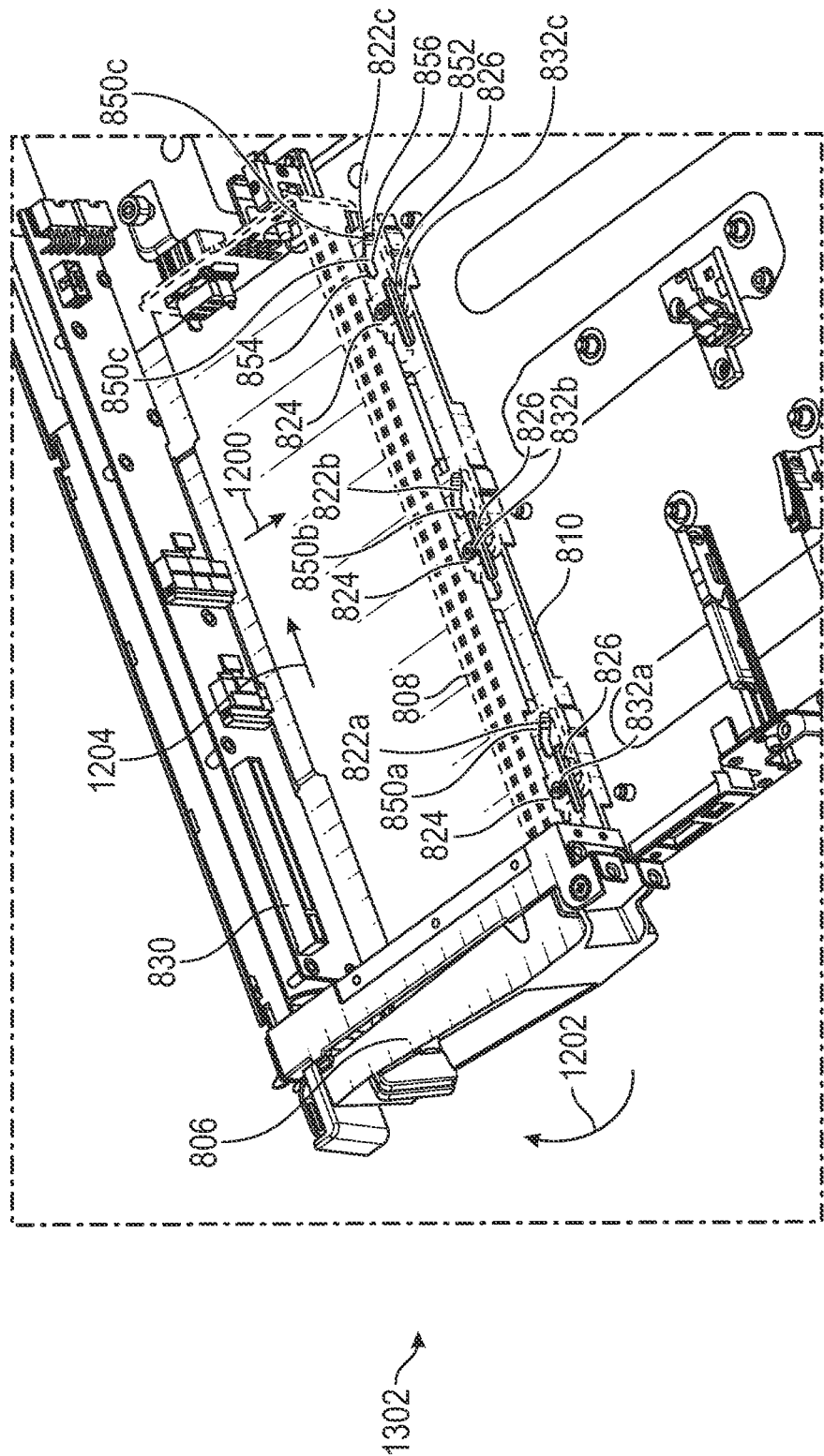
FIG. 20 is a top right isometric view of aspects of an embodiment of a low-profile apparatus for facilitating the service of an electronic device.

FIG. 20 is, like FIG. 19, a top right isometric view of aspects of an embodiment of a low-profile apparatus for facilitating the service of an electronic device in which guide bar 808 has been rendered partially transparent to better illustrate the travel of follower pins 850a-850c within tracks 822a-822c. However, in FIG. 20, handle 806 has been rotated in direction 1202 pushing slider 810 in direction 1204. As a result, from the previous position of pin 850c (shown in FIG. 19), the movement of slider 810 has caused pin 850c to travel from "retracted" end 856, through diagonal section 852, and into "inserted" end 854. The insertion of connector 302 into connector 830 is caused by the relative movement of pin 850c in direction 1200 from end 856 to end 854.

In FIG. 7, et seq., the elevator mechanism 800 is shown to move carrier 700 horizontally; however, one of skill will realize that carrier 700 and elevator mechanism 800 may be used in other orientations as needed to adapt to different configurations of the chassis connection, the chassis slot, and electronic device connector. Similarly, one of skill will realize that the constraint of slider 810 to linear motion in direction 1204, 1306 and of guide bar in directions 1200, 1300 may be accomplished using other arrangements, e.g., track 826, which takes the form of a slot in the figures, may be implemented by a raised section on slider 810 with a grooved section of chassis 828 constraining the raised section to linear motion.

In an embodiment, the relative positions of followers 850 and tracks 822 may be reversed. That is, followers 850 may be provided on slider 810 and tracks 822 may be provided in guide bar 808. In an embodiment, track 822 may be a raised track with followers 850 configured to travel along a raised track, e.g., follower 850 may be "U"-shaped with raised track 822 fitting within the "U." In an embodiment, slider 810 may be associated with guide bar 808 such that slider 810 travels up and down with the motion of guide bar 808 with respect to chassis 828. That is embodiments are not limited to the illustrated configuration of slider, track, and follower. In an embodiment, the actuation of slider 810 provided by the rotation of handle 806 may be provided by other means, e.g., by pushing slider 810 directly. In an embodiment, the rotation of handle 806 may be transmitted by cords attached to each follower 850, a set of cords drawing the follower forward, or a set of cords drawing the follower rearward according to the handle rotation. In an embodiment, the actuation of slider 810 may be performed manually by the user. In an embodiment, a spring may bias guide bar 808 to the disconnected position. In an embodiment, a spring may bias guide bar 808 to the connected position.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
 a chassis including a first connector;
 a first elongate member connected to a rotatable handle, the first elongate member being constrained to move along the chassis between a first position and a second position and parallel to a first axis;
 a second elongate member constrained to move parallel to a second axis perpendicular to the first axis and between a third position closer to the first connector relative to a fourth position further from the first connector;
 a first track including a first track position and a second track position, the first track position being closer to the first connector than the second track position; and
 a first track follower engaging the first track and movable along the first track between the first track position and the second track position, wherein:
 the first track is associated with one of the first elongate member or the second elongate member and the first track follower is associated with the other of the first elongate member or the second elongate member; and
 when the first elongate member is in the second position and the first track follower is at the second track position, movement of the first elongate member from the second position to the first position by rotation of the handle causes the first track follower to move along the first track to the first track position, which causes the second elongate member to move from the fourth position to the third position.

2. The apparatus of claim 1, wherein:
 the first track follower is associated with the second elongate member and the first track is associated with the first elongate member;
 the first track includes a first slot;
 the first track follower includes a tab with a tooth extending into the first slot.

3. The apparatus of claim 1, wherein the second elongate member includes a first edge, the apparatus further including a third elongate member including a first groove, wherein the first groove engages with the first edge allowing the third elongate member to move parallel to the first axis with respect to the second elongate member and constraining the third elongate member to move with the second elongate member when the second elongate member moves parallel to the second axis.

4. The apparatus of claim 3 wherein:
 the second elongate member includes a second edge;
 the third elongate member includes a second groove; and
 the second groove engages with the second edge, the engaging of the first groove with the first edge and the second groove with the second edge allowing the third elongate member to move parallel to the first axis with respect to the second elongate member and constraining the third elongate member to move with the second elongate member when the second elongate member moves parallel to the second axis.

5. The apparatus of claim 1, wherein, when the second elongate member is connected to an electronic device including a second connector, movement of the second elongate member from the fourth position to the third position is sufficient to connect the second connector to the first connector.

6. The apparatus of claim 1, wherein:
 a first plane is parallel to both the first axis and second axis; and
 movement within the first track is parallel to the first plane.

7. The apparatus of claim 6, wherein:
 the first track includes a first groove in the first elongate member; and
 the first track follower includes a first protrusion configured to follow within the first track.

8. The apparatus of claim 7, further comprising:
 a second track in the first elongate member; and
 a second track follower in the second elongate member, wherein:
 the second track and second track follower are configured as the first track and first track follower such that movement of the second track follower with respect to the second track is identical to movement of the first track follower with respect to the first track.

9. The apparatus of claim 1, wherein the first elongate member is constrained to move parallel to the first axis by a second protrusion associated with the chassis travelling within a second slot within the first elongate member.

10. The apparatus of claim 9, wherein the second elongate member is constrained to move parallel to the second axis by a third protrusion associated with the chassis travelling within a third slot within the second elongate member.

11. The apparatus of claim 10, wherein the second protrusion and the third protrusion are the same protrusion.

12. A method for removing an electronic device from a chassis for servicing, comprising:
 moving a first elongate member parallel to a first axis and with respect to the chassis from a first position to a second position by rotating a rotatable handle connected to the first elongate member;
 causing, by the movement of the first elongate member to the second position in response to rotation of the handle, a first track follower to move along a first track from a first track position to a second track position, the first track position being closer to a first connector on the chassis than the second track position;
 causing, by the movement of the first track follower to the second track position, a second elongate member to move parallel to a second axis perpendicular to the first axis from a third position closer to the first connector to a fourth position further from the first connector;
 causing, by the movement of the second elongate member to the fourth position, a second connector associated with the electronic device to disconnect from the first connector; and
 removing the electronic device from the chassis in a motion parallel to the first axis.

13. The method of claim 12, wherein:
 the electronic device is attached to a third elongate member including a first groove and a second groove; and
 the third elongate member is attached to the second elongate member by a first edge of the second elongate member and a second edge of the second elongate member being received by the first groove and the second groove, respectively, such that the third elongate member may move parallel to the first axis with respect to the second elongate member and is constrained to move with the second elongate member when the second elongate member moves parallel to the second axis.

14. The method of claim 12, wherein:
 a first plane is parallel to both the first axis and second axis; and movement of the first track follower along the first track is parallel to the first plane.

15. The method of claim 14, wherein:
the first track includes a first groove in the first elongate member; and
the first track follower includes a first protrusion configured to be movable within the first track.

16. The method of claim 15, wherein:
the first elongate member includes a second track; and
the second elongate member includes a second track follower; and
the second track and second track follower are configured as the first track and first track follower such that movement of the second track follower with respect to the second track is identical to movement of the first track follower with respect to the first track.

17. The apparatus of claim 12, wherein the first elongate member is constrained to move parallel to the first axis by a second protrusion associated with the chassis travelling within a second slot within the first elongate member.

18. The apparatus of claim 17, wherein the second elongate member is constrained to move parallel to the second axis by the second protrusion travelling within a third slot within the second elongate member.

* * * * *